(12) United States Patent
Haraguchi

(10) Patent No.: US 7,044,355 B2
(45) Date of Patent: May 16, 2006

(54) BONDING APPARATUS AND BONDING EXTERNAL APPEARANCE INSPECTION DEVICE

(75) Inventor: Manabu Haraguchi, Musashimurayama (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 246 days.

(21) Appl. No.: 10/781,375

(22) Filed: Feb. 18, 2004

(65) Prior Publication Data
US 2005/0127136 A1 Jun. 16, 2005

(30) Foreign Application Priority Data
Feb. 19, 2003 (JP) ............................. 2003-040856

(51) Int. Cl.
*B23K 31/12* (2006.01)

(52) U.S. Cl. ................ 228/103; 228/105; 219/121.63; 219/121.64; 219/121.83

(58) Field of Classification Search ................ 228/103, 228/104, 105; 219/121.63, 121.64, 121.65, 219/121.66, 121.83; 29/833; 156/351, 379
See application file for complete search history.

(56) References Cited

U.S. PATENT DOCUMENTS 5,687,031 A * 11/1997 Ishihara ...................... 359/821
5,721,079 A * 2/1998 Goto ............................ 430/22
6,464,126 B1 * 10/2002 Hayata et al. ............... 228/105
6,683,731 B1 * 1/2004 Hayata ........................ 359/744

FOREIGN PATENT DOCUMENTS

| JP | 5-88091 | 4/1993 |
| JP | 5-292379 | 11/1993 |
| JP | 8-304043 | 11/1996 |
| JP | 9-126739 | 5/1997 |
| JP | 11-037723 | * 12/1999 |

OTHER PUBLICATIONS

Translation, Dec. 1999, Japan, Oshima et al.*

* cited by examiner

*Primary Examiner*—Tom Dunn
*Assistant Examiner*—Michael Aboagye
(74) *Attorney, Agent, or Firm*—Koda & Androlia

(57) ABSTRACT

A wire bonder 50 in which light rays 66 that leave an object on a carrying stand 60 pass through a light path 80 that passes through a parallel flat plate and reach an imaging camera 70 as light rays 68. The light path 80 that passes through a parallel flat plate includes a half-mirror 82 disposed in the light path, a parallel flat plate 86, and a reflective mirror 88 which is disposed perpendicular to the optical axis of the light rays 96 that have passed through the parallel flat plate 86 and which performs a mirror reflection operation, in a plane perpendicular to the optical axis, on the light rays 96, so that the light rays again return to the parallel flat plate 86 as reflected light 98.

18 Claims, 12 Drawing Sheets

BONDING APPARATUS AND BONDING EXTERNAL APPEARANCE INSPECTION DEVICE

BACKGROUND OF THE INVENTION

1. Field of the Invention

The present invention relates to a bonding apparatus and a bonding external appearance inspection apparatus, and more particularly relates to a bonding apparatus that performs bonding and a bonding external appearance inspection apparatus that performs a bonding external appearance inspection using an optical measuring instrument that varies the focal point position for a plurality of objects of bonding that have different heights.

2. Prior Art

In bonding apparatuses such as die bonders that position and die-bond chips on a substrate and wire bonders that connect leads on a substrate and pads on chips by means of wires, the positional relationships of the substrate and chips or lead and pads, etc., are measured by means of a position detection camera, etc., and bonding work is performed while positioning is performed.

Since there are differences in height between the substrate and chips or leads and pads, there are cases in which it is necessary to adjust the focal point position in accordance with the height of the object of bonding that is being measured in the position detection camera. A technique is known in which the focal point position of the optical system is varied by inserting parallel flat plates that have an appropriate thickness and refractive index in the light path. Using this principle, a geometric-solid shape measuring instrument is disclosed in Patent Reference 1, a three-dimensional imaging device is disclosed in Patent Reference 2, a camera is disclosed in Patent Reference 3, and a microscope is disclosed in Patent Reference 4.

Patent Reference 1
  Japanese Patent Application Laid-Open (Kokai) No. 9-126739

Patent Reference 2
  Japanese Patent Application Laid-Open (Kokai) No. 8-304043

Patent Reference 3
  Japanese Patent Application Laid-Open (Kokai) No. 5-88091

Patent Reference 4
  Japanese Patent Application Laid-Open (Kokai) No. 5-292379

In recent years, as semiconductor devices such as LSI, etc., have become finer, there has been a requirement for increased precision of positioning in bonding apparatuses. For example, in order to perform the die bonding of a plurality of chips with high precision, the positioning between the substrate and chips has become finer; furthermore, in order to handle the increasingly fine pitch of leads and pads, there is a requirement for more accurate positioning between such leads and pads.

Furthermore, so-called stacked elements have been developed in which die bonding and wire bonding are performed with chips stacked on top of other chips, so that the difference in height of objects of bonding that must be brought into focus has tended to increase, thus increasing the need for a wide range of variability of the focal point position in order to achieve accurate positioning.

Moreover, in cases where the external appearance of objects of bonding is inspected before and after bonding, there is likewise a strong demand for an increased range of variability of the focal point position in order to ascertain whether or not accurate positioning has been accomplished, etc.

When the height difference is thus large, and the required precision of positioning is increased, sufficiently precise measurements cannot be performed in the case of conventional techniques in which the length of the light path is varied by inserting parallel flat plates into the light path. The conditions involved in this case are shown in FIG. 14. FIG. 14($a$) shows a case in which a parallel flat plate 12 is disposed in the light path so that the optical axis 10 and the normal of the parallel surfaces of the parallel flat plate 12 are accurately parallel to each other, and FIG. 14($b$) shows a case in which such a parallel flat plate 12 is disposed in the light path so that the normal of the parallel surfaces of the parallel flat plate 12 is slightly inclined with respect to the optical axis 10. In FIG. 14($a$), assuming that the light rays 14 are focused at a point 16 on the optical axis 10 when no parallel flat plate is disposed in the light path, then, when the parallel flat plate 12 is placed in the light path, the focal point position of the light rays 14 shifts on the optical axis and moves to a point 18 in accordance with the thickness and refractive index of the parallel flat plate 12. In other words, the light path length of the optical system is extended, and the focal point position varies.

When the parallel flat plate 12 is set at an inclination with respect to the optical axis 10 as shown in FIG. 14($b$), the focal point position of the light rays 14 does not fall on the optical axis 10, but instead moves to a point 20 which is separated from the optical axis 10 in a plane that is perpendicular to the optical axis 10. In other words, the focal point position of the light rays 14 is shifted to a point 20 which is separated by a distance of $\Delta L$ from the point 18 where the focal point is located when the parallel flat plate is accurately positioned perpendicular to the optical axis 10.

The part that detects an image of the object of bonding in the position detection camera is a two-dimensional imaging element such as a CCD (charge coupled device); accordingly, the deviation in the focal point position in the plane perpendicular to the optical axis 10 is translated into deviation of the image in the two-dimensional plane. Consequently, the images of the leads and pads, etc., deviate in the imaging plane, so that the positions of the leads and pads, etc., cannot be accurately detected.

SUMMARY OF THE INVENTION

The object of the present invention is to provide a bonding apparatus and a bonding external appearance inspection apparatus which are equipped with an optical measuring instrument that can solve the above-described problems encountered in the prior art and can prevent image deviation that is generated when the focal point position is varied.

As a result of an analysis of the mechanism of image deviation that occurs when a parallel flat plate is not accurately disposed perpendicular to the optical axis, it was discovered that the image deviation that occurs when light rays are caused to pass once through a parallel flat plate can be eliminated through mutual cancellation by using light rays that are caused to pass twice through the parallel flat plate under fixed conditions.

FIG. 1 shows how light rays 14 advance in a case where the normal of the parallel surfaces of the parallel flat plate is inclined by an angle of $\alpha$ with respect to the optical axis 10.

In this figure, light rays 14 that are incident on one surface of the parallel flat plate 12 at a point 32 on the optical axis 10 are shown. With reference to the optical axis 10, the angle at which the light rays 14 are incident on the parallel flat plate 12 is designated as θ, and the angle following incidence on the parallel flat plate 12 is designated as β. According to the rule of refraction, Numerical Expression 1

$$N(\theta+\alpha)=N'(\beta+\alpha) \quad (1)$$

Numerical Expression 2

$$\beta=\{N(\theta+\alpha)/N'\}-\alpha \quad (2)$$

where N is the refractive index of air, N' is the refractive index of the parallel flat plate 12, and d is the thickness of the parallel flat plate 12.

Here, it is assumed that the angles α, β and θ are in ranges where sin α=α, sin β=β and sin θ=θ in approximate terms. For example, the range in which such an approximation can be used is a range in which sin α is approximately 0.1 or less. The reason that a limitation of applicability is placed on the range in which this approximation can be made is that in the range exceeding this approximation range, spherical aberration and astigmatic aberration, etc., are generated in the parallel flat plate. In the case of a light path length varying element that does not generate such aberration, e.g., in the case of the parallel reflective mirror or four-reflection-surface reflective mirror described later, the approximation may be used without this limitation.

The height variation L with reference to the optical axis 10 that occurs when the light rays 14 pass through the thickness d of the parallel flat plate 12 is the distance of the point 34 at which the light rays 14 leave the parallel flat plate 12 from the optical axis 10.

Numerical Expression 3

$$L=\beta d=[\{N(\theta+\alpha)/N'\}-\alpha]d \quad (3)$$

If the component of the inclination angle α of the parallel flat plate 12 in this is designated as ΔL, then it is seen that Numerical Expression 4

$$\Delta L=[\{N\alpha/N'\}-\alpha]d \quad (4)$$

From the results of Equation (4), the height variation component ΔL' of the light rays in the case of an inclination angle of −α is as follows:

Numerical Expression 5

$$\Delta L'=[-\{N\alpha/N'\}+\alpha]d \quad (5)$$

Accordingly, ΔL'=−ΔL. In other words, as is shown in FIG. 2, when light rays that have passed through the parallel flat plate 36 with an inclination angle of α then pass through the parallel flat plate 38 with an inclination angle of −α, then, from Equation (3), the height variation $L_1$ of the light rays that occurs when the light rays pass through the thickness of the parallel flat plate 36 is Numerical Expression 6

$$L_1=\beta d=[\{N(\theta+\alpha)/N'\}-\alpha]d \quad (6)$$

and the height variation $L_2$ of the light rays that occurs when the light rays pass through the thickness of the parallel flat plate 38 is Numerical Expression 7

$$L_2=\beta d=[\{N(\theta+\alpha)/N'\}+\alpha]d \quad (7)$$

so that by causing the light rays 14 to pass through the parallel flat plate 36 and parallel flat plate 38, Numerical Expression 8

$$L_1+L_2=2\{N\theta/N'\}d \quad (8)$$

Thus, the deviation of the light rays in the height direction caused by the angle of inclination of the parallel flat plate, i.e., the image deviation, can be eliminated by mutual cancellation.

In order to achieve ΔL'=−ΔL for a single parallel flat plate, it is sufficient to cause the light rays to pass twice through this single parallel flat plate under fixed conditions. These conditions may be summarized as the following three conditions, as may be understood from the calculation process from Equation (1) through Equation (8).

(a) The inclination angle α should be a small angle in the range in which sin α=α in approximate terms. As described above, this condition is applicable in the case of a parallel flat plate.

(b) If the inclination angle in the case of the first incidence of the light rays is α, then the system should be devised so that the inclination angle in the case of the second incidence of the light rays is −α.

(c) The light rays should not pass through an optical element that has a so-called "power" while the light rays are being caused to pass twice through the parallel flat plate. Here, the term "power" refers to refractive power which is the reciprocal of the focal distance f, and the term "optical element that has a power" refers to an element, typically a lens, that can vary the angle of the light rays with respect to the optical axis. The reason for requiring this condition (c) is that if the light rays pass through an optical element that has a power while the image deviation that has been generated during the first passage through the parallel flat plate has still not been eliminated, image deformation that is difficult to correct is generated.

Accordingly, the principle of the present invention is realized even in the internal part of an optical system such as an imaging camera, etc., if conditions (a) through (c) are satisfied. However, in cases where the optical system such as an imaging camera, etc., is an object-side telecentric optical system, it is desirable that the parallel flat plate be disposed on the outside of the lens that is closest to the object side, i.e., on the outside of the lens system. In other words, the reason for this is as follows: namely, the term "object-side telecentric optical system" refers to an optical system in which the main light rays on the object side (the light rays that cross the optical axis at the position of the diaphragm) are more or less parallel to the optical axis; accordingly, the disposition of the parallel flat plate with respect to the main light rays on the object side can ideally satisfy the three above-described conditions.

Assuming that conditions (a) through (c) are satisfied, and that ΔL'=−ΔL for one parallel flat plate accidentally disposed at an inclination in the light path, the following two methods can be used to eliminate, by mutual cancellation, the image deviation caused by this inclined disposition.

The first method is a method in which a mirror-reflection operation in the plane perpendicular to the optical axis is performed on the light rays that have passed through the parallel flat plate, so that the light rays are caused to be incident again from the back side of the parallel flat plate (i.e., the side from which the light rays left the parallel flat plate). For example, a reflective mirror whose reflective surface is perpendicular to the optical axis is installed on the back side of the parallel flat plate. The reason for this is that in this case, since the light rays are incident from the back side of the parallel flat plate, the angle of inclination of the parallel flat plate is precisely $-\alpha$.

Furthermore, the term "mirror reflection" or "mirror-reflection operation" refers to an operation which is such that in a cases where a point P and a plane a are given, a perpendicular line PO is dropped from P to a, and a point P' is obtained which satisfies the condition that the length PO' is equal to the length of PO on an extension of this line. P' corresponds to a mirror image of P in cases where there is a planar mirror at a, and is generally called a mirror image that closes at a. As a concrete example, when light rays are incident on a reflective mirror disposed perpendicular to the optical axis, the reflected light constitutes light rays obtained by performing a mirror-reflection operation on the incident light.

Besides a single reflection by a reflective mirror, a mirror-reflection operation can also be performed using light obtained by three reflections using, for example, a pentagonal prism and a triangular prism. Generally, light that has been reflected an odd number of times can be used.

The second method is a method in which the light rays that have passed through the parallel flat plate are caused to rotate 180 degrees about the optical axis, and the rotated light rays are caused to be incident again from the front side of the parallel flat plate (i.e., the side on which the light rays were initially incident). In this case as well, causing light rays that have been rotated 180 degrees about the optical axis to be incident is equivalent to leaving the light rays "as is" and causing the parallel flat plate to rotate 180 degrees about the optical axis. In FIG. 2, if the parallel flat plate 36 is caused to rotate 180 degrees about the optical axis, the resulting relationship is exactly the same as the relationship between the parallel flat plate 38 and the optical axis 10. Accordingly, in this case as well, if the angle of inclination at the time of the first incidence is $\alpha$, the angle of inclination at the time of the second incidence is $-\alpha$.

The rotation of the light rays 180 degrees about the optical axis can be accomplished by using two right-angled prisms, and appropriately setting the disposition of these prisms. For example, if the optical axis is set as the Z axis, the original image can be rotated 180 degrees about the Z axis by using the first prism to invert the image with respect to front and back about the X axis, and using the second prism to invert this image with respect to front and back about the Y axis.

Thus, even if a single parallel flat plate is inserted at an inclination with respect to the optical axis, the image deviation generated during a single passage of the light rays through the parallel flat plate can be eliminated through mutual cancellation by using light rays that are caused to pass twice through the parallel flat plate under fixed conditions. The above methods can also be used in an optical element other than a parallel flat plate which varies the light path length. Specifically, even if this optical element is inserted so that the element is inclined by an angle of $\alpha$ with respect to the optical axis, if the angle of inclination at the time of the first incidence is set at $\alpha$, the image deviation generated during the first passage of the light rays through the optical element can be eliminated through mutual cancellation by causing the light rays to pass twice through the optical element so that the angle of inclination at the time of the second incidence is $-\alpha$. Furthermore, as described above, the applicability limit for the approximation performed in the description of the principle of the invention using a parallel flat plate is a limit that is used to prevent the aberration that is generated by a parallel flat plate; in the case of a light path length varying element that varies only the light path length and does not generate any aberration, this applicability limit for the above-described approximation is not necessary.

The present invention is a bonding apparatus which performs bonding with the focal point position varied for an object of bonding that has a plurality of different heights, the bonding being performed using an optical measuring instrument that includes:

an image focusing lens, a two-dimensional image sensor that detects an image of each object of bonding created by the image focusing lens, and a light path that passes through a parallel flat plate, the light path being disposed at an intermediate point in the light path that extends from the object of bonding toward the two-dimensional image sensor;

wherein the bonding apparatus is characterized in that the light path that passes through a parallel flat plate is a light path which:

receives light rays from the object of bonding, conducts the light rays from the object of bonding to the two-dimensional image sensor after causing the light rays from the object of bonding to pass twice through a parallel flat plate that has a refractive index and thickness that corresponds to the height of the object of bonding, and varies a focal point position of an optical system while eliminating by mutual cancellation the image deviation generated by the passage of the light rays through the parallel flat plate.

In the above-described construction, a parallel flat plate is disposed at an intermediate point in the light path that extends from the object of bonding toward the two-dimensional image sensor, so that light rays from the object of bonding are caused to pass twice through the parallel flat plate. Accordingly, the image deviation that is generated in a case where the parallel flat plate that is used to vary the focal point position is unintentionally disposed at an inclination can automatically be eliminated by mutual cancellation, so that bonding can be performed with precise positioning with respect to a plurality of objects of bonding that have different heights.

Furthermore, the above-described passing of the light rays in twice can be repeated a multiple number of times; for example, the light rays from the object of bonding can be caused to pass through the parallel flat plate an even number of times, i.e., 2N times where N is an integer of 1 or greater. In this case, the image deviation that is generated in the case of the light rays that have passed through the parallel flat plate (2N−1) times can be automatically eliminated through mutual cancellation by the passage of the light rays through the parallel flat plate for the 2Nth time. Furthermore, even if there is only a single parallel flat plate, the light path length of the optical system can be varied by varying the number of times N of repetition; moreover, the range of variability of the light path length can be increased by increasing the number of times N of repetition.

It is preferable that a mirror-reflection-operation optical element, which performs a mirror reflection operation, in a plane perpendicular to the optical axis, on light rays that are incident from one surface of the parallel flat plate and pass through the parallel flat plate, thus causing the light rays to be incident on another surface of the parallel flat plate, be provided in the light path that passes through the parallel flat plate, so that light rays, which are incident from the other surface of the parallel flat plate and again passes through the parallel flat plate, are conducted to the two-dimensional image sensor.

In the above-described construction, the image deviation that is generated by the passage of the light rays from the object of bonding through the parallel flat plate can be eliminated through mutual cancellation by causing these light rays to pass twice through the parallel flat plate using the first method described above in the principle of the present invention.

It is preferable that a rotational-operation optical element, which makes a 180-degree rotational operation about the optical axis on light rays that are incident from one surface of the parallel flat plate and pass through the parallel flat plate, thus causing the light rays to be incident again on the first surface of the parallel flat plate, be provided in the light path that passes through the parallel flat plate, so that light rays, which again pass through the parallel flat plate, are conducted to the two-dimensional image sensor.

In the above-described construction, the image deviation that is generated when the light rays from the object of bonding passes through the parallel flat plate can be eliminated through mutual cancellation by causing these light rays to pass twice through the parallel flat plate using the second method described above in the principle of the present invention.

It is preferable that the light path that passes through the parallel flat plate be provided at an intermediate point on the light path that extends from the object of bonding toward the image focusing lens, in a case where the optical system of the optical measuring instrument is an object-side telecentric optical system.

It is preferable that the bonding apparatus include a parallel flat plate set in which a plurality of parallel flat plates in which the amount of light path length variation is respectively different are provided as a single set, and a parallel flat plate selection and disposition means which selects one or more parallel flat plate from the parallel flat plate set and disposes selected flat plate in the light path that passes through parallel flat plates.

In the above-described construction, a parallel flat plate combination that causes the desired amount of variation in the light path length can be obtained by selecting and combining parallel flat plates that cause different amounts of variation in the light path length from the parallel flat plate set, and the parallel flat plates thus combined can be simultaneously disposed in the light path that passes through these parallel flat plates. Accordingly, numerous different heights of objects of bonding can be handled using a small number of different types of parallel flat plates.

It is preferable that the ratio of the amount of light path length variation between the respective parallel flat plates in the parallel flat plate set is set to be 2. With this structure, respective parallel flat plates are arranged with the amounts of variation of the light path length set at a ratio of 1:2:4:8:16, and so on. Accordingly, the desired amount of variation in the light path length can be obtained using a small number of different types of parallel flat plates.

Furthermore, the present invention is a bonding apparatus which performs bonding with the focal point position varied for an object of bonding that has a plurality of different heights, the bonding being performed using an optical measuring instrument that includes:
an image focusing lens,
a two-dimensional image sensor that detects an image of each object of bonding created by the image focusing lens, and
a light path that that passes through a light path length varying element, the light path being disposed at an intermediate point in the light path that extends from the object of bonding toward the two-dimensional image sensor;

wherein the bonding apparatus is characterized in that:
the light path that passes through a light path length varying element includes a parallel reflective mirror as a light path length varying element, the parallel reflective mirror being comprised of two reflective surfaces facing each other and disposed parallel to each other at a specified interval and varying the light path length of light rays that pass through the parallel reflective mirror when the parallel reflective mirror is rotated as a whole about a rotational axis that is perpendicular to the optical axis; and
the light path that passes through a light path length varying element is a light path which:
receives light rays from the object of bonding,
conducts the light rays from the object of bonding to the two-dimensional image sensor after causing the light rays from the object of bonding to pass twice through the parallel reflective mirror that varies the light path length according to the height of the object of bonding, and
varies the focal point position of the optical system while eliminating, by mutual cancellation, the image deviation generated by the passing of the light rays through the parallel reflective mirror.

In the above-described construction, the focal point position can be varied by rotating the parallel reflective mirror. The parallel reflective mirror is disposed at an intermediate point in the light path that extends from the object of bonding toward the two-dimensional image sensor, and the light rays from the object of bonding are caused to pass through the parallel reflective mirror twice. Accordingly, the image deviation that is generated by the rotation of the parallel reflective mirror can be automatically eliminated by mutual cancellation, so that bonding can be performed with precise positioning with respect to a plurality of objects of bonding that have different heights.

Furthermore, the present invention is a bonding apparatus which performs bonding with the focal point position varied for an object of bonding that has a plurality of different heights, the bonding being performed using an optical measuring instrument that includes:
an image focusing lens,
a two-dimensional image sensor that detects an image of each object of bonding created by the image focusing lens, and
a light path that that passes through a light path length varying element, the light path being disposed at an intermediate point in the light path that extends from the object of bonding toward the two-dimensional image sensor;

wherein the bonding apparatus is characterized in that:
the light path that passes through a light path length varying element includes a four-reflection-surface reflective mirror as a light path length varying element, the four-reflection-surface reflective mirror being comprised of four reflective surfaces facing each other and disposed parallel to each other at a specified interval and varying the light path length that corresponds to a light path length inside the four-reflection-surface reflective mirror, relative to a case in which the four-reflection-surface reflective mirror is not inserted, when the four-reflection-surface reflective mirror is inserted as a whole in the light path; and the light path that passes through a light path length varying element is a light path which:

receives light rays from the object of bonding, conducts the light rays from the object of bonding to the two-dimensional image sensor after causing the light rays from the object of bonding to pass twice through the four-reflection-surface reflective mirror that has a light path length corresponding to the height of the object of bonding, and varies the focal point position of the optical system while eliminating, by mutual cancellation, the image deviation generated by the passing of the light rays through the four-reflection-surface reflective mirror.

In the above-described construction, the focal point position is varied by way of inserting or removing the four-reflection-surface reflective mirror. This four-reflection-surface reflective mirror is disposed at an intermediate point in the light path that extends from the object of bonding toward the two-dimensional image sensor, and the light rays from the object of bonding are caused to pass twice through this four-reflection-surface reflective mirror. Accordingly, the image deviation that is generated in a case in which the four-reflection-surface reflective mirror is unintentionally disposed at an inclination can be automatically eliminated by mutual cancellation, so that bonding can be performed with precise positioning with respect to a plurality of objects of bonding that have different heights.

It is preferable that a mirror-reflection-operation optical element, which performs a mirror reflection operation in the plane perpendicular to optical axis on the light rays that are incident from one side of the light path length varying element and pass through the light path length varying element, thus causing the light rays to be incident on the above-described one side of the light path length varying element, be disposed in the light path that passes through a light path length varying element, so that the light rays, which are incident from the other side of the light path length varying element and again pass through the light path length varying element, are conducted to the two-dimensional image sensor.

It is preferable that a rotational-operation optical element, which makes a 180-degree rotational operation about optical axis on the light rays that are incident from one side of the light path length varying element and pass through the light path length varying element, thus causing the light rays to be incident again on the one side of the light path length varying element, be disposed in the light path that passes through a light path length varying element, so that the light rays that again pass through the light path length varying element are conducted to the two-dimensional image sensor.

It is preferable that in a case where the optical system of the optical measuring instrument is an object-side telecentric optical system, then the light path that passes through a light path length varying element be provided at an intermediate point on the light path that extends from the object of bonding toward the image focusing lens.

It is preferable that the four-reflection-surface reflective mirror be comprised of: a right-angled outside reflective mirror in which a first reflective surface and a second reflective surface are disposed at an angle of 270 degrees, and a right-angled inside reflective mirror in which a third reflective surface and a fourth reflective surface are disposed at an angle of 90 degrees; and the first reflective surface and third reflective surface are provided to face each other, the second reflective surface and fourth reflective surface are provided to face each other, and the reflective surfaces facing each other are parallel to each other at a specified interval.

It is preferable that the mirror-reflection-operation optical element be a reflective mirror, the mirror-reflection-operation optical element be an optical element that is a combination of a pentagonal prism and a triangular prism, and the rotational-operation optical element be comprised of a first prism that reflects incident light rays twice and a second prism that twice reflects light rays from the first prism.

Furthermore, the present invention is a bonding external appearance inspection apparatus which performs a bonding external appearance inspection with the focal point position varied for an object of bonding that has a plurality of different heights, the inspection being performed using an optical measuring instrument that includes:

an image focusing lens, a two-dimensional image sensor that detects an image of each object of bonding created by the image focusing lens, and a light path that passes through a parallel flat plate, the light path being disposed at an intermediate point in the light path that extends from the object of bonding toward the two-dimensional image sensor;

wherein the bonding external appearance inspection apparatus is characterized in that the light path that passes through a parallel flat plate is a light path which:

receives light rays from the object of bonding, conducts the light rays from the object of bonding to the two-dimensional image sensor after causing the light rays from the object of bonding to pass twice through a parallel flat plate that has a refractive index and thickness that corresponds to the height of the object of bonding, and varies the focal point position of the optical system while eliminating the image deviation generated by the passing of the light rays through a parallel flat plate.

In addition, the present invention is a bonding external appearance inspection apparatus which performs a bonding external appearance inspection with the focal point position varied for an object of bonding that has a plurality of different heights, the inspection being performed using an optical measuring instrument that includes:

an image focusing lens, a two-dimensional image sensor that detects an image of each object of bonding created by the image focusing lens, and a light path that that passes through a light path length varying element, the light path being disposed at an intermediate point in the light path that extends from the object of bonding toward the two-dimensional image sensor;

wherein the bonding external appearance inspection apparatus is characterized in that:

the light path that passes through a light path length varying element includes a parallel reflective mirror as a light path length varying element, the parallel reflective mirror being comprised of two reflective surfaces facing each other and disposed parallel to each other at a specified interval and varying the light path length of light rays that pass through the parallel reflective mirror when the parallel reflective mirror is rotated as a whole about a rotational axis that is perpendicular to the optical axis; and the light path that passes through a light path length varying element is a light path which:

receives light rays from the object of bonding, conducts the light rays from the object of bonding to the two-dimensional image sensor after causing the light rays from the object of bonding to pass twice through the parallel reflective mirror that varies the light path length according to the height of the object of bonding, and varies the focal point position of the optical system while eliminating, by mutual cancellation, the image deviation generated by the passing of the light rays through the parallel reflective mirror.

Further, the present invention is a bonding external appearance inspection apparatus which performs a bonding external appearance inspection with the focal point position varied for an object of bonding that has a plurality of different heights, the inspection being performed using an optical measuring instrument that includes:

an image focusing lens, a two-dimensional image sensor that detects an image of each object of bonding created by the image focusing lens, and a light path that that passes through a light path length varying element, the light path being disposed at an intermediate point in the light path that extends from the object of bonding toward the two-dimensional image sensor;

wherein the bonding external appearance inspection apparatus is characterized in that:

the light path that passes through a light path length varying element includes a four-reflection-surface reflective mirror as a light path length varying element, the four-reflection-surface reflective mirror being comprised of four reflective surfaces facing each other and disposed parallel to each other at a specified interval and varying the light path length that corresponds to a light path length inside the four-reflection-surface reflective mirror, relative to a case in which the four-reflection-surface reflective mirror is not inserted, when the four-reflection-surface reflective mirror is inserted as a whole in the light path; and the light path that passes through a light path length varying element is a light path which:

receives light rays from the object of bonding, conducts the light rays from the object of bonding to the two-dimensional image sensor after causing the light rays from the object of bonding to pass twice through the four-reflection-surface reflective mirror that has a light path length corresponding to the height of the object of bonding, and varies the focal point position of the optical system while eliminating, by mutual cancellation, the image deviation generated by the passing of the light rays through the four-reflection-surface reflective mirror.

DETAILED DESCRIPTION OF THE INVENTION

Embodiments of the present invention will be described in detail below with reference to the accompanying drawings. In the following description, a wire bonder for stacked elements is used as an example of a bonding apparatus, an imaging camera that is a combination of an image focusing lens and a CCD is used as the optical measuring instrument that measures the position of the stacked element, and the parallel flat plate is disposed between the stacked element and the image focusing lens, i.e., outside the imaging camera.

Constructions other than the above construction may be used; for example, the bonding apparatus may also be a die bonder, or an apparatus other than a bonding apparatus that is used in bonding, e.g., a bonding external appearance inspection apparatus that inspects the external appearance of semiconductor devices, etc., following bonding. The optical measuring instrument may also be a general optical microscope that does not include a CCD. Furthermore, the parallel flat plate may also be disposed inside the imaging camera, as long as an optical element that has a power is not included in the light path that passes through the parallel flat plate as described above. The optical system of he imaging camera may also be an object-side telecentric optical system.

Figure 1:
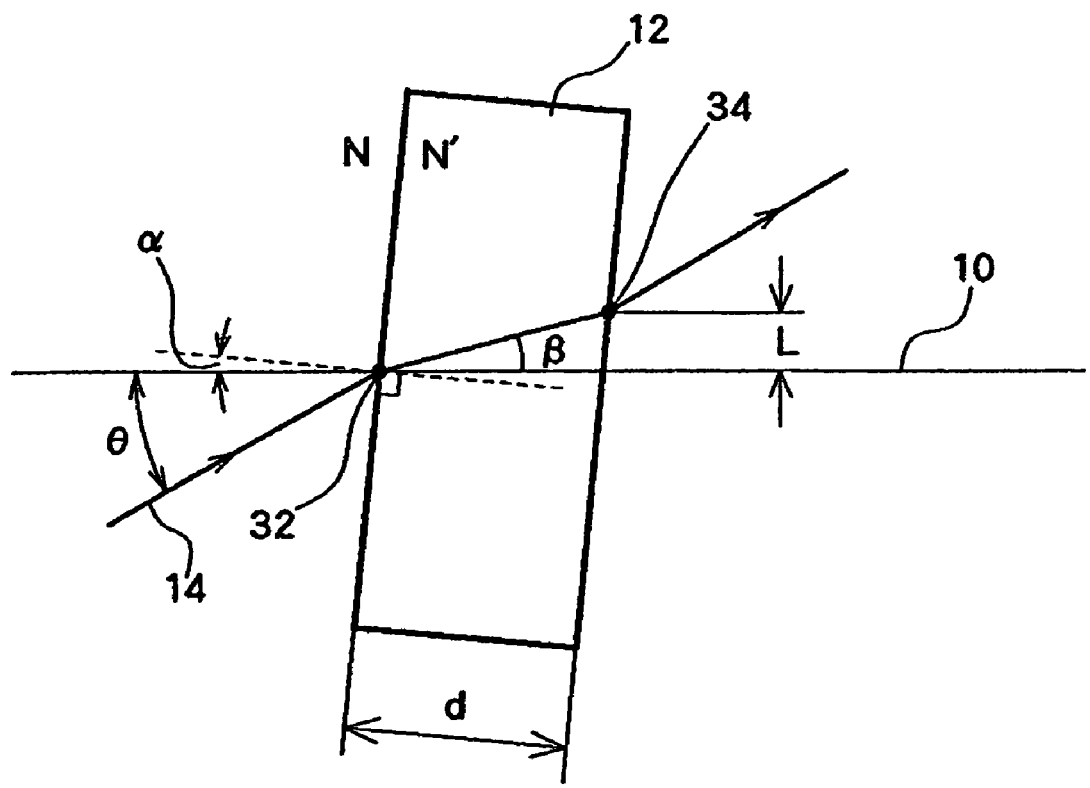
FIG. 1 shows how the light rays advance in a case where the normal of the parallel surfaces of the parallel flat plate is inclined by an angle of α with respect to the optical axis.
Figure 2:
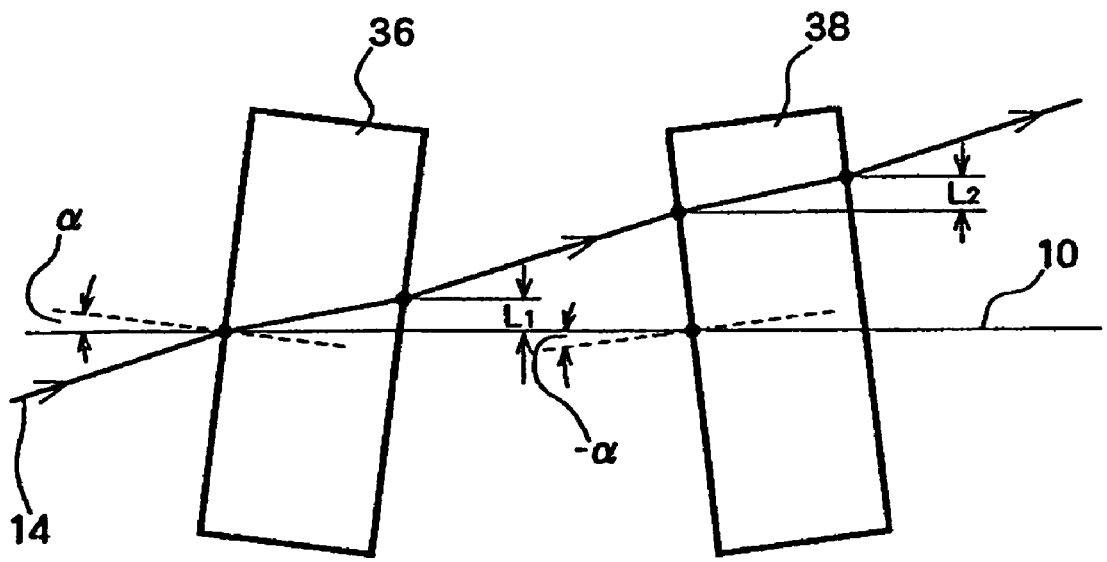
FIG. 2 is a diagram which illustrates how the image deviation caused by inclined disposition is eliminated by mutual cancellation, in order to illustrate the principle of the present invention, when the light rays that have passed through a parallel flat plate oriented at an inclination angle of α are again caused to pass through a parallel flat plate oriented at an inclination angle of −α.
Figure 3:
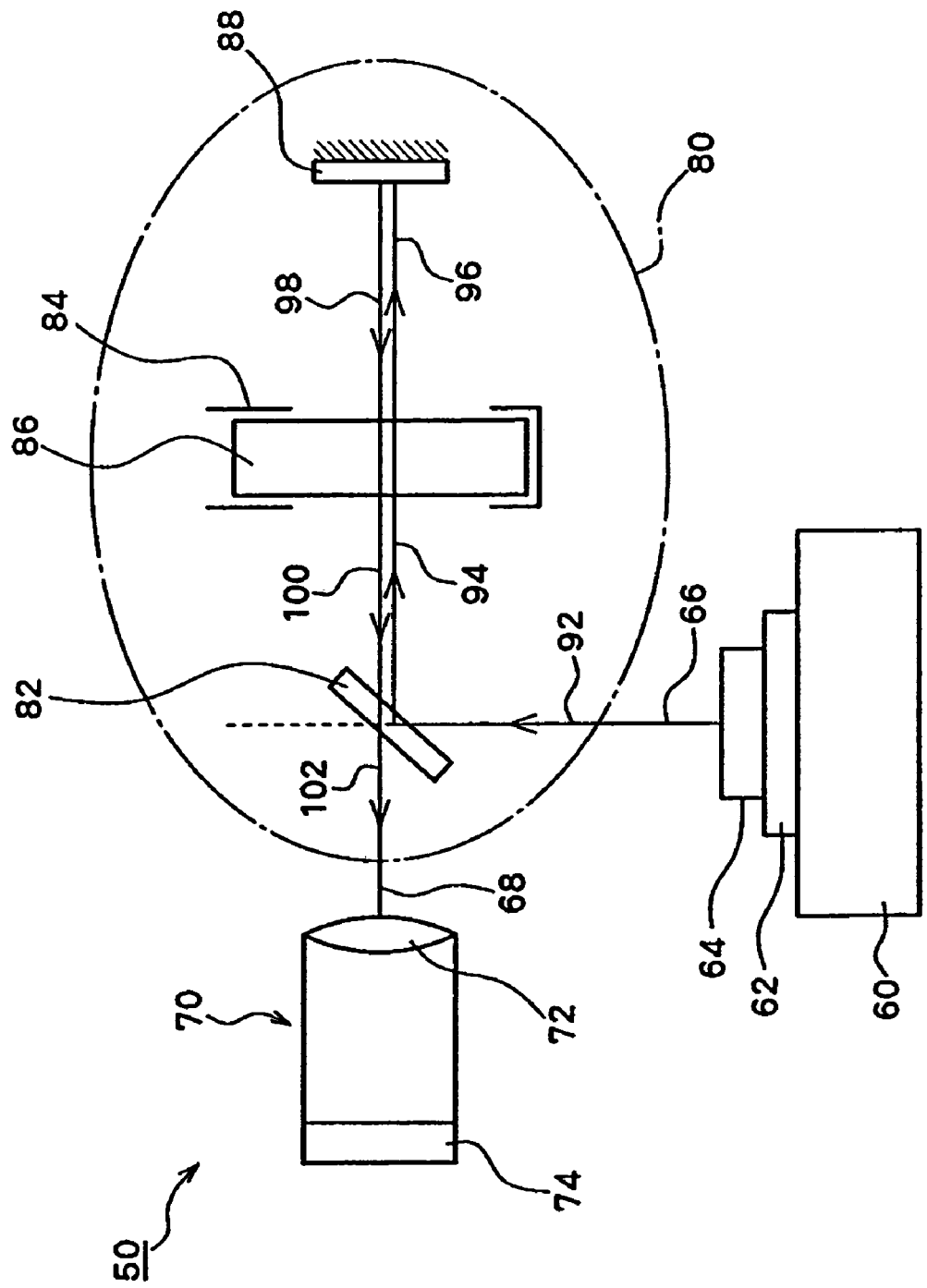
FIG. 3 shows how the positions of pads, etc., on a stacked element are measured by the imaging camera in a wire bonder constituting an embodiment of the present invention.

FIG. 3 shows how the positions of pads, etc., on a stacked element comprising chips 62 and 64 stacked in two tiers and held on a carrying stand 60 are measured by the imaging camera 70 in a wire bonder 50. The light rays 66 that leave the stacked element pass through a light path 80 that passes through a parallel flat plate used to vary the light path length, and reach the imaging camera 70 as light rays 68. The imaging camera 70 comprises an image focusing lens 72 and a CCD 74 in which a plurality of imaging elements are disposed in two dimensions. In this figure, the light rays 66 from the chips 62 and 64 are finally conducted to the image focusing lens 72 as light rays 68, so that an image of the chips 62 and 64 is focused on the CCD 74. The positions of respective portions that constitute the image of the chips 62 and 64, e.g., the positions of pads, etc., are determined by a position calculating device, not shown, using signals from the plurality of imaging elements that are disposed in two dimensions in the CCD 74.

The light path 80 that passes through a parallel flat plate comprises a half-mirror 82 that is disposed in the light path, a parallel flat plate 86 that can be inserted into or removed from the light path by a parallel flat plate insertion guide 84, and a reflective mirror 88.

The half-mirror 82 is a semi-transparent mirror which is disposed in the light path of the light rays 66 at an angle of inclination of 45 degrees with respect to the optical axis, and which has the function of altering the path of advance of the light rays 92 from the object by 90 degrees. The term "semi-transparent mirror" refers to an optical element which reflects a proportion of the incident light rays and allows the remaining light rays to pass through; for example, an element formed by coating a glass plate with a semi-transparent thin film can be used.

The parallel flat plate 86 is an optical element which is disposed perpendicular to the optical axis of the light rays 94 whose path of advance has been bent 90 degrees by the half-mirror 82, and which is constructed from a transparent material that has the function of altering the light path length of the light rays passing through this parallel flat plate in accordance with the thickness and refractive index of the parallel flat plate. Glass or plastic, etc., can be used as the material of this parallel flat plate.

The reflective mirror 88 is an optical element which is disposed perpendicular to the optical axis of the light rays 96 that have passed through the parallel flat plate 86, and which has the function of performing a mirror reflection operation in the plane perpendicular to the optical axis on the light rays 96, so that these light rays again return to the parallel flat plate 86 as reflected light 98. A glass plate that is plated with a metal, etc., on one side, or a metal plate with a polished surface can be used as this element.

The reflected light 98 that is returned by the reflective mirror 88 is incident from the back side of the parallel flat plate 86; this light passes a second time through the parallel flat plate 86 and is incident on the half-mirror 82 as light rays 100. The half-mirror 82 functions as a transparent element with respect to the light rays 100, so that the light rays 100 pass through the half-mirror 82 and are conducted to the imaging camera 70.

Accordingly, the length of the light path of the light rays that pass through the light path 80 that passes through the parallel flat plate is altered, compared to a case where the parallel flat plate 86 is not inserted in the light path, as a result of these light rays passing twice through the parallel flat plate 86. The amount of variation Δs in the light path length that occurs as a result of the passage of the light rays twice through the parallel flat plate 86 is given by the following equation, where N is the refractive index of air, N' is the refractive index of the parallel flat plate 86, and s is the distance through which the light rays pass assuming a linear advance of the light rays through the parallel flat plate 86.

Numerical Expression 9

$$\Delta s = 2s\{(N/N')-1\} \quad (9)$$

Since the light rays 66 from the chips 62 and 64 are conducted to the imaging camera 70 as light rays 68 in a state in which the light rays appear to float upward by the above-described amount of variation Δs in the light path length, the focal point position of the imaging camera 70 is more distant by a corresponding amount.

Furthermore, after passing once through the parallel flat plate 86, the light rays 66 from the chips 62 and 64 are subjected to a mirror reflection operation in the plane perpendicular to the optical axis by the reflective mirror 88, and again pass through the parallel flat plate 86. Accordingly, even in a case where the parallel flat plate 86 is for some reason not disposed perpendicular to the optical axis, e.g., even in a case where the parallel flat plate 86 is inserted at an inclination because of looseness in the parallel flat plate insertion guide 84, etc., the image deviation that is generated by passage through the parallel flat plate 86 can be eliminated by mutual cancellation as explained in the first method described in the principle of the present invention.

Figure 4:
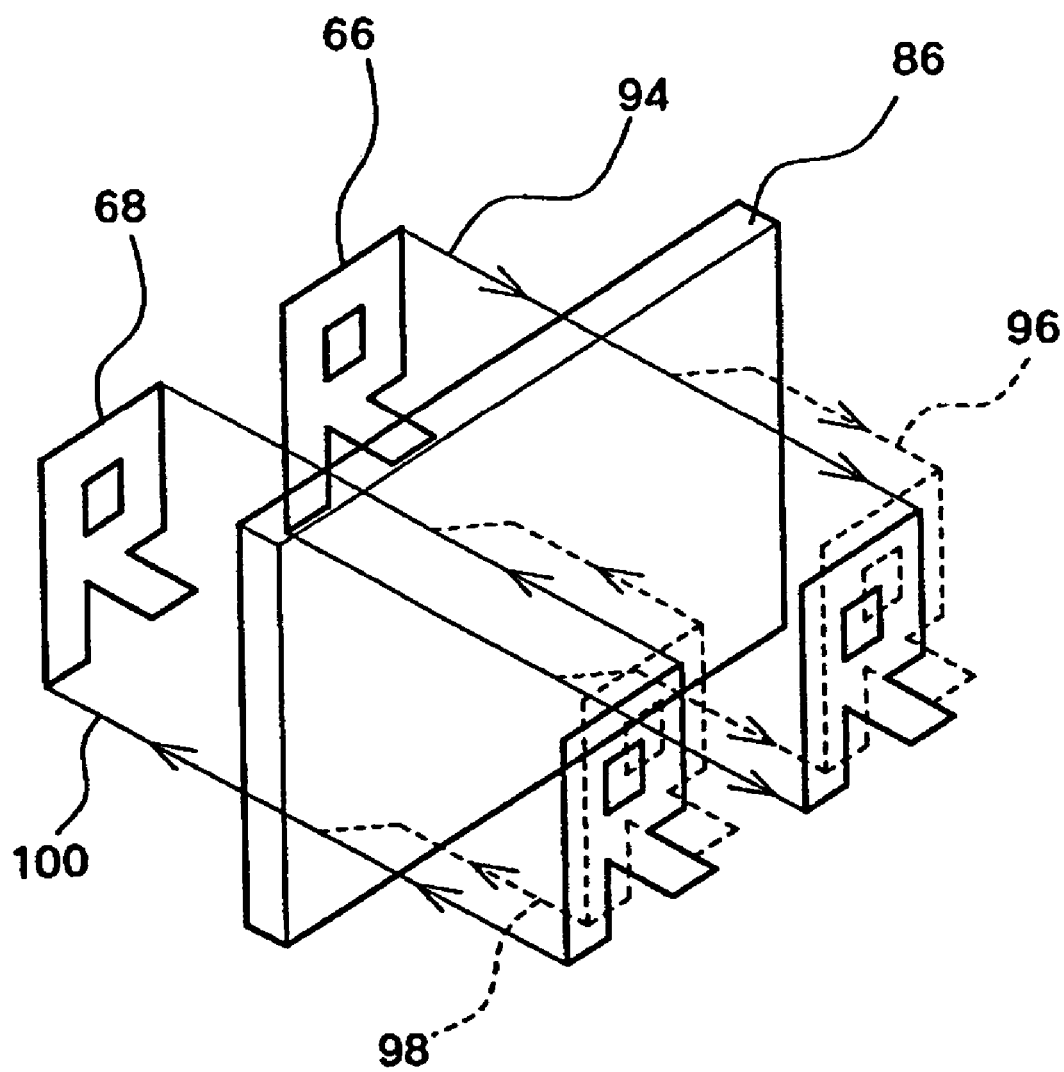
FIG. 4 is a diagram which illustrates in model form the elimination of image deviation by mutual cancellation in the wire bonder shown in FIG. 3.

FIG. 4 is a diagram which illustrates in model form the elimination of image deviation by mutual cancellation. For purposes of illustration, the image of the object is indicated by the character "R". The light rays 66 from this "R" on the object side are converted into light rays 94 via the half-mirror, and reach the reflective mirror after passing through the parallel flat plate 86. The passing light rays and image of "R" on the reflective mirror in a case where the parallel flat plate 86 is accurately disposed perpendicular to the optical axis are indicated by solid lines. If the parallel flat plate 86 is disposed at an inclination with respect to the optical axis, the passing light rays and the image of "R" on the reflective mirror show a deviation on the plane perpendicular to the optical axis, as is shown by the broken lines. Even if such an image deviation is generated, the light rays 98 on which a mirror reflection operation in the plane perpendicular to the optical axis is performed by the reflective mirror, for the image of "R" that shows this deviation, are again incident from the back side of the parallel flat plate 86, so that the light rays 98 can again advance through the parallel flat plate 86, which is inclined with respect to the optical axis, in precisely the opposite direction from the light path through which the light rays initially passed. Accordingly, the light rays 100 that have again passed through the parallel flat plate 86 are restored to an image that is the same as the original image of "R", and the image deviation is eliminated by mutual cancellation.

Figure 5:
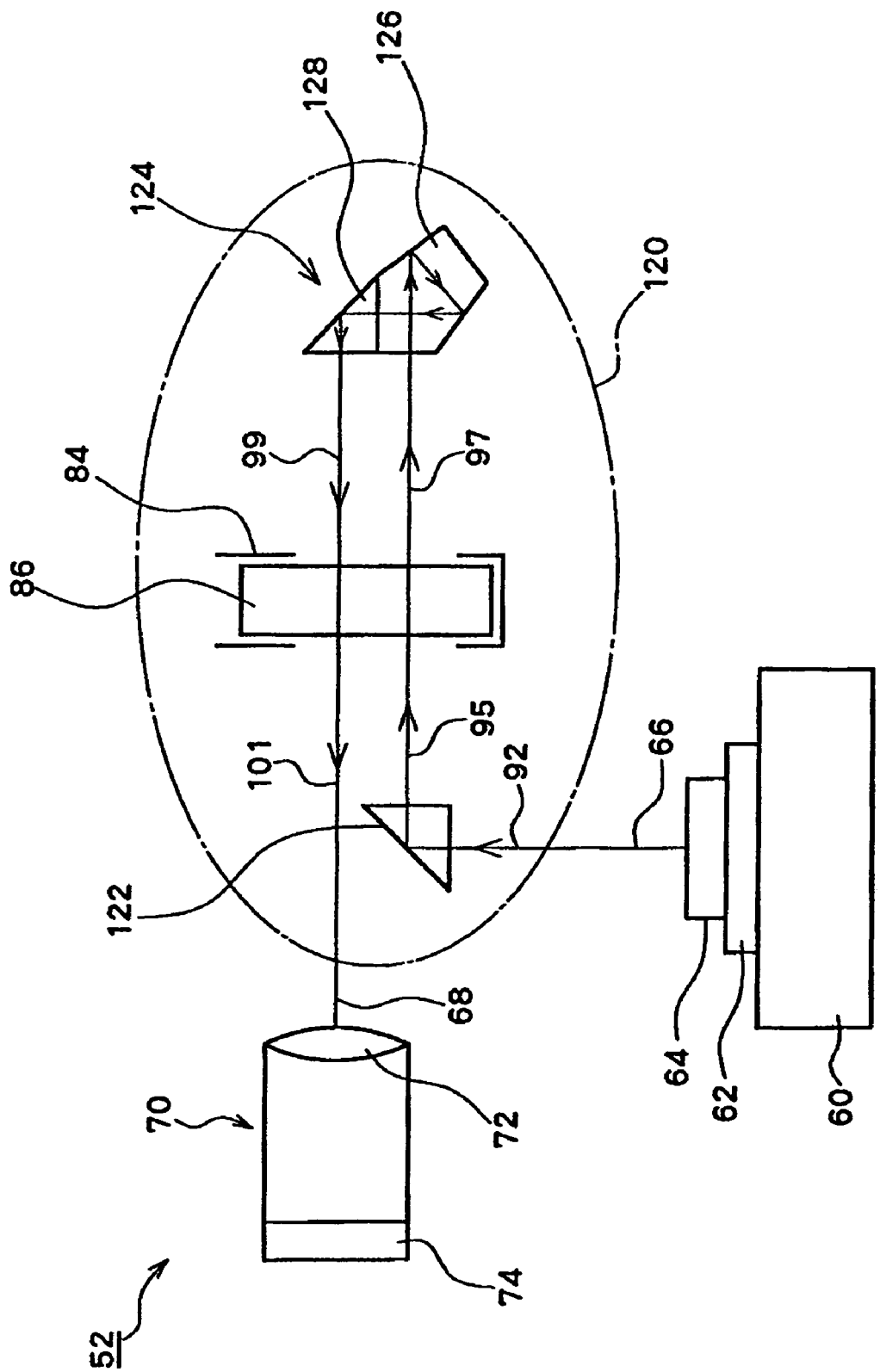
FIG. 5 shows the wire bonder in another embodiment of the present invention.

FIG. 5 shows a wire bonder 52 using another light path 120 that passes through a parallel flat plate. In the case of this light path 120 that passes through a parallel flat plate, a prism 122 is used instead of the above-described half-mirror, and an optical element 124 that reflects the light three times is used instead of the reflective mirror. An element that is constructed by combining a pentagonal prism 126 and a triangular prism 128 can be used as the optical element 124 that reflects the light three times. In FIG. 5, elements that are the same as in FIG. 3 are labeled with the same symbols, and a detailed description of these elements is omitted.

The prism 122 is disposed in the light path so that one surface of this prism receives light rays 92 from the object at an angle of incidence of 45 degrees. The incident light rays can be completely reflected by appropriately selecting the relationship between the refractive index of the prism 122 and the refractive index of air. Thus, the light rays 95 that are completely reflected so that the path of the advance of these light rays is altered by 90 degrees are caused to be incident on the parallel flat plate 86. Since there is no half-mirror in the path of the advance of the light rays 101, either, these light rays reach the imaging camera 70 "as is" without any loss. Accordingly, a brighter image can be obtained than in the case using a half-mirror 82 shown in FIG. 3, where, for example, 25% of the light from the object is supplied to the imaging camera 70, since the light that is incident on the half-mirror is divided into reflected light and transmitted light at a certain distribution ratio.

Furthermore, the bright light rays 97 that have passed through the parallel flat plate 86 are subjected to a mirror reflection operation in the plane perpendicular to the optical axis of these light rays by the optical element 124 that reflects the light three times. The light rays 99 that have been subjected to this mirror reflection operation are caused to be incident on the back side of the parallel flat plate 86, and the light rays 101 that have again passed through the parallel flat plate 86 are conducted "as is" to the imaging camera 70.

In order to perform a mirror reflection operation in the plane perpendicular to the optical axis on the light rays that have passed once through the parallel flat plate 86, it is sufficient to reflect these light rays an odd number of times. In cases where it is desired to reflect the light rays once, a simple reflective mirror can be used as shown in FIG. 3. In cases where it is desired to reflect the light rays three times, an optical element combining a pentagonal prism and a triangular prism can be used as shown in FIG. 5. Similarly, in cases where the light rays are reflected some other odd number of times, an optical element with an appropriate structure can be used.

In FIG. 5, a case was illustrated in which a prism was used instead of a half-mirror, and an optical element that reflected the light an odd number of times was used instead of a reflective mirror. However, a combination of a half-mirror and an optical element that reflects the light an odd number of times may also be used.

Figure 6:
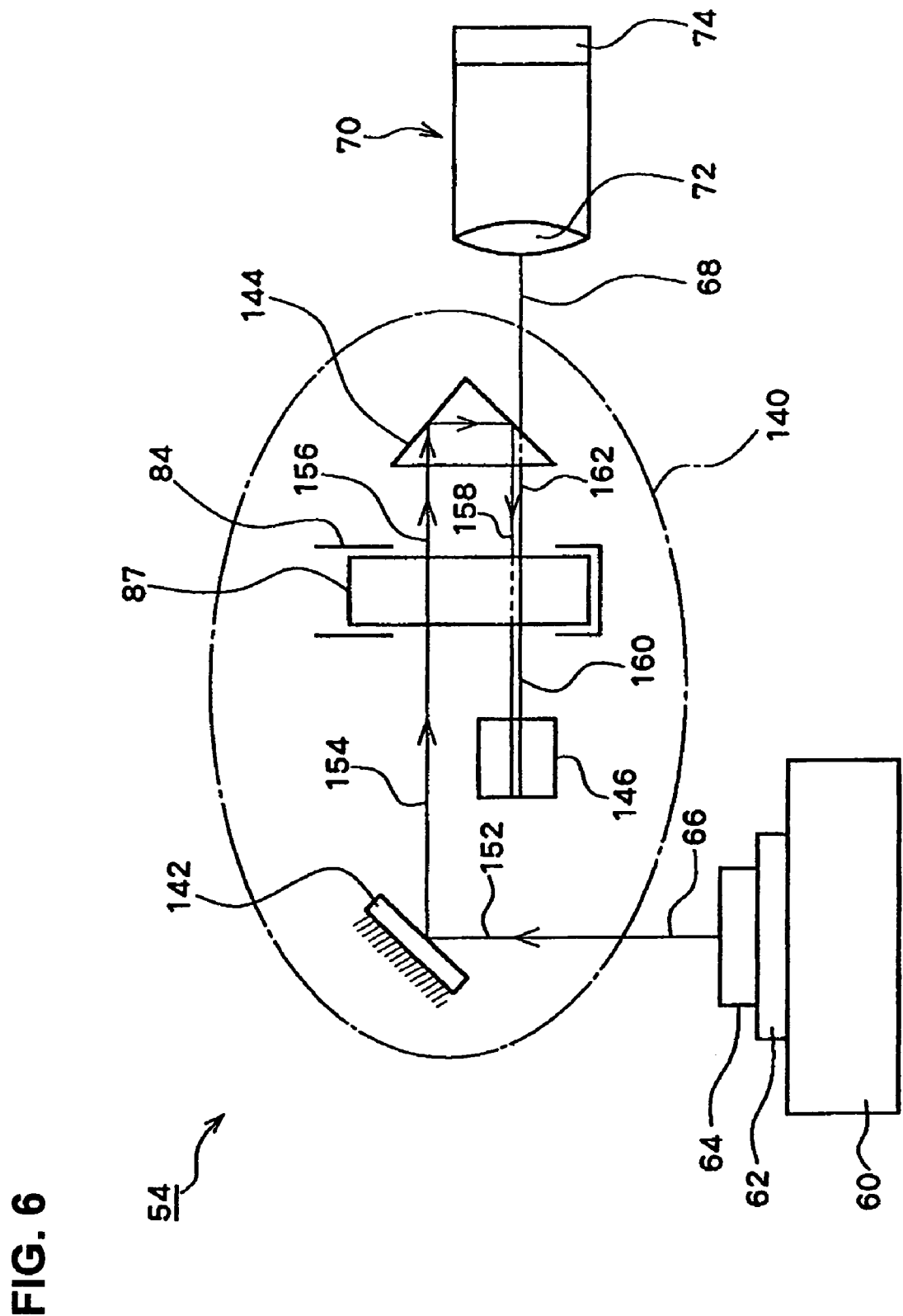
FIG. 6 shows the wire bonder in still another embodiment of the present invention.
Figure 7:
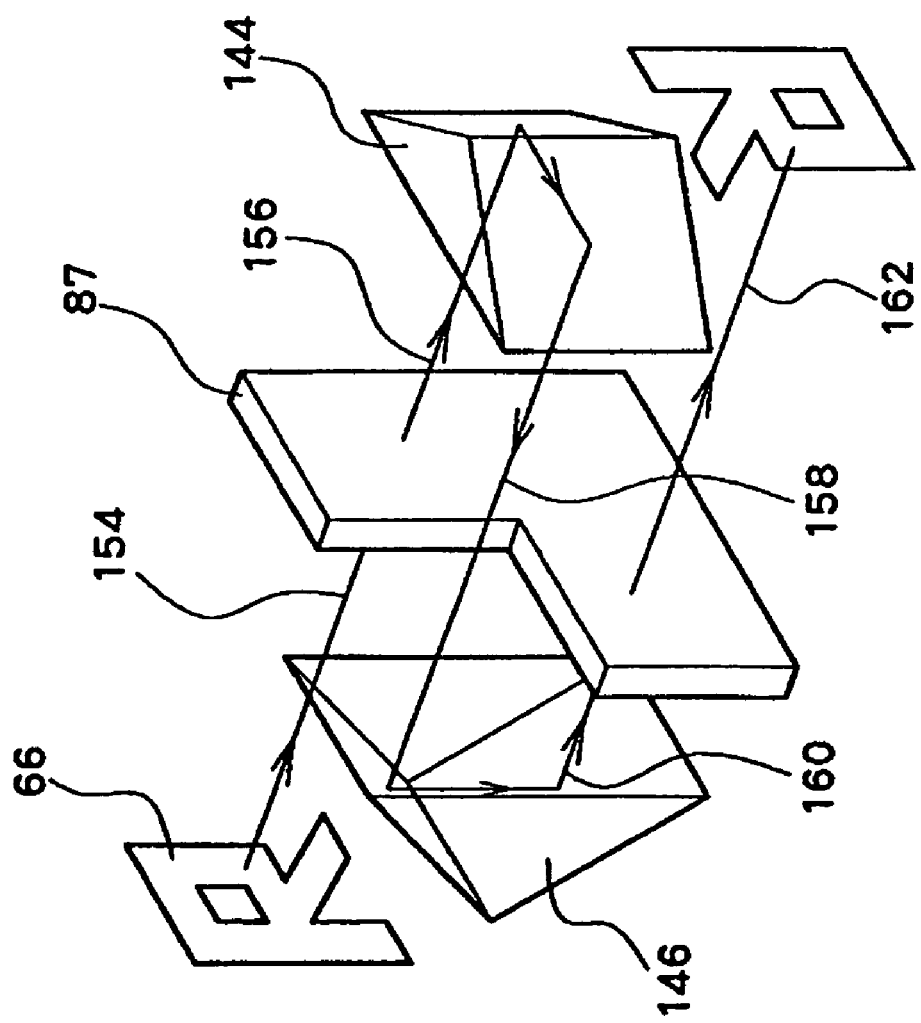
FIG. 7 shows in model form, in a perspective view, a portion of the light path that passes through a parallel flat plate in another embodiment of the present invention.

FIG. 6 shows a wire bonder 54 that uses still another light path 140 that passes through a parallel flat plate. FIG. 7 shows a portion of the light path 140 that passes through this parallel flat plate in model form in a perspective view. In this embodiment, the light path 140 that passes through a parallel flat plate comprises a reflective mirror 142 that is disposed in the light path, a parallel flat plate 87 that can be inserted into and removed from the light path by a parallel flat plate insertion guide 84, a first prism 144, and a second prism 146. The first prism 144 and second prism 146 are installed in order to cause the light rays that have passed once through the parallel flat plate 87 to rotate 180° about the optical axis, so that these light rays are again caused to be incident from the surface on the side of the parallel flat plate 87 on which the light rays were initially incident.

The reflective mirror 142 is a reflective mirror which is disposed in the light path at an angle of inclination of 45 degrees with respect to the optical axis of the light rays 66, and which has the function of altering the path of the advance of the light rays 152 from the object by 90 degrees. The parallel flat plate 87 is an optical element comprising a transparent material which is disposed perpendicular to the optical axis of the light rays 154 whose path of advance has been bent 90 degrees by the reflective mirror 142, and which has the function of altering the length of the light path of the light rays in accordance with the thickness and refractive index of the parallel flat plate, as in the case of the parallel flat plate 86 shown in FIG. 3. In regard to the shape of this parallel flat plate, as is shown in FIG. 7, the parallel flat plate has a structure in which a cut-out is formed in a portion of the parallel flat plate, so that light rays can be returned to the front side from the back side of the parallel flat plate without being passed through the parallel flat plate.

The first prism 144 is a prism which reflects twice the light rays 156 that have passed through the parallel flat plate 87; the disposition of the two reflective surfaces of this prism is set so that the image is inverted, with respect to front and back, about the X axis shown in FIG. 7 as a result of thus being reflected twice. Besides a prism, it would also be possible to use some other optical element that reflects the light twice, such as a right-angled reflective mirror. The light rays 158 pass through the cut-out portion of the parallel flat plate 87, and advance to the front side from the back side of the parallel flat plate.

The second prism is a prism which reflects the light rays 158 twice; the disposition of the two reflective surfaces of this prism is set so that the image is inverted, with respect to front and back, about the Y axis shown in FIG. 7 as a result of thus being reflected twice. Besides a prism, it would also be possible to use some other optical element that reflects the light twice, such as a right-angled reflective mirror.

The light rays 162 that have been rotated 180 degrees about the optical axis by the first prism 144 and second prism 146, and that have again passed through the parallel flat plate 87, are conducted to the imaging camera 70.

Accordingly, compared to a case in which no parallel flat plate 87 is inserted in the light path, the length of the light path of the light rays passing through the light path 140 that passes through a parallel flat plate is altered as a result of the passage of the light rays twice through the parallel flat plate 87, so that the focal point position of the imaging camera 70 becomes more distant by a corresponding amount.

Furthermore, after passing once through the parallel flat plate 87, the light rays 66 from the chips 62 and 64 are rotated 180 degrees about the optical axis and again pass through the parallel flat plate 87; accordingly, even in a case where the parallel flat plate 87 is for some reason not disposed perpendicular to the optical axis, the image deviation that is generated by passage through the parallel flat plate 87 can be eliminated by mutual cancellation as explained in the second method described in the principle of the present invention.

Figure 8:
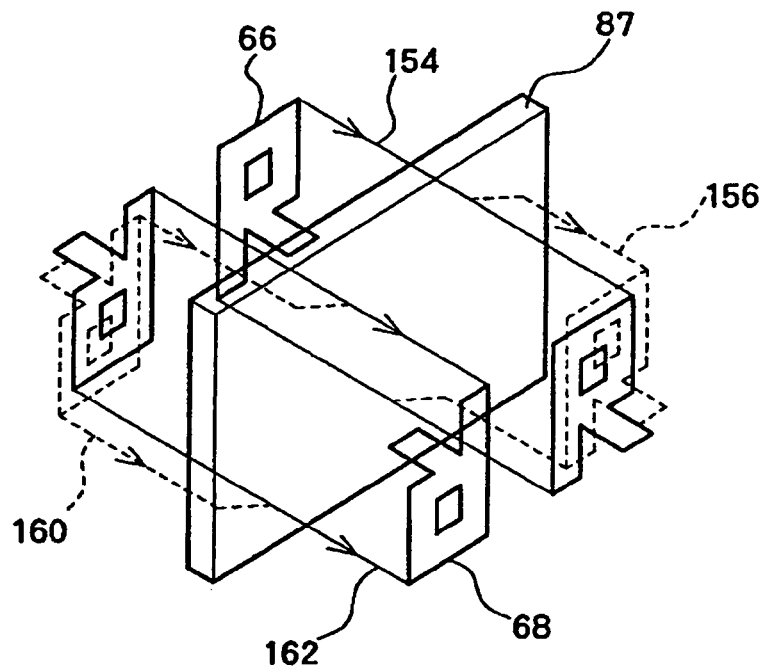
FIG. 8 is a diagram which illustrates in model form the elimination of image deviation by mutual cancellation in the wire bonder shown in FIG. 6.

FIG. 8 illustrates in model form the elimination of image deviation by mutual cancellation. The light rays 66 from the "R" on the objective side are converted into light rays 154 via the reflective mirror; these light rays then pass through the parallel flat plate 87 and reach the first prism. The passing light rays and image of "R" that is incident on the first prism in a case where the parallel flat plate 87 is accurately disposed perpendicular to the optical axis are indicated by solid lines. If the parallel flat plate 87 is disposed at an inclination with respect to the optical axis, the passing light rays and the image of "R" that is incident on the first prism show a deviation on the plane perpendicular to the optical axis, as is shown by the broken lines. Even if such a deviation occurs, it is sufficient if the light rays 160 that have been rotated 180 degrees about the optical axis, for the image of "R" that shows this image deviation, by the first prism and second prism are again incident on the front side of the parallel flat plate 87. As a result, the image deviation of the light rays 160 that have again passed through the parallel flat plate 87 is eliminated by mutual cancellation in an image state in which the original image of "R" is rotated 180 degrees, so that the original image is restored as explained in the second method described in the principle of the present invention.

Figure 9:
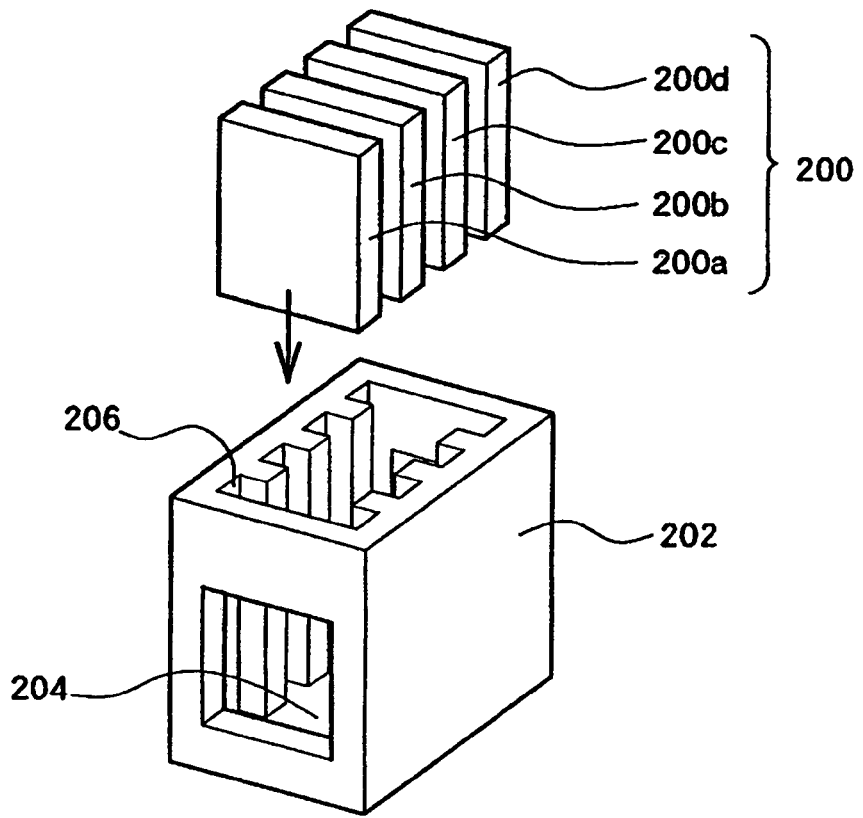
FIG. 9 shows how a plurality of parallel flat plates are used in combination in the embodiment of the present invention.

FIG. 9 shows how a plurality of parallel flat plates are used in combination in order to alter the light path length of the light path that passes through parallel flat plates. In this example, the desired amount of variation in the length of the light path is obtained by combining four parallel flat plates 200a, 200b, 200c and 200d. In addition to a light ray passage window 204, slide grooves 206 that allow the independent insertion and removal of the respective parallel flat plates are disposed in the parallel flat plate insertion guide 202 in order to dispose the combination of parallel flat plates in the light path that passes through parallel flat plates.

The combination of parallel flat plates may use a plurality of parallel flat plates that cause different amounts of variation in the light path length; alternatively, a plurality of parallel flat plates that cause the same amount of variation in the light path length may be combined. The total amount of variation in the light path length is given by $\Sigma\Delta(2s)_i$ where $\Delta(2s)_i$ is the amount of variation in the light path length that is caused by each parallel flat plate. In a case where four parallel flat plates can be inserted into or removed from the parallel flat plate insertion guide 202 as shown in FIG. 9, an arbitrary number of parallel flat plates ranging from 0 plates to 4 plates can be disposed in the light path that passes through parallel flat plates.

It is convenient if the plurality of parallel flat plates used for insertion into and removal from the parallel flat plate insertion guide are prepared beforehand as a parallel flat plate set. In this case, it is desirable that the ratio of the amount of variation in the light path length caused by the respective parallel flat plates be set at 2. For example, where the units of the amount of variation in the light path length are indicated by a, the amounts of variation of the light path length caused by the respective parallel flat plates are built in as a, 2a, 4a, 8a, 16a, 32a and so on. If this is done, an arbitrary amount of variation in the length of the light path can be obtained using a smaller number of parallel flat plates. For example, in the case of a parallel flat plate insertion guide 202 in which four parallel flat plates can be inserted or removed, as in the above-described example, a variation in the length of the light path in increments of a from 0 to 36a can be obtained by preparing six parallel flat plates in which the respective amounts of variation in the length of the light path caused by these plates are a, 2a, 4a, 16a and 32a.

Figure 10:
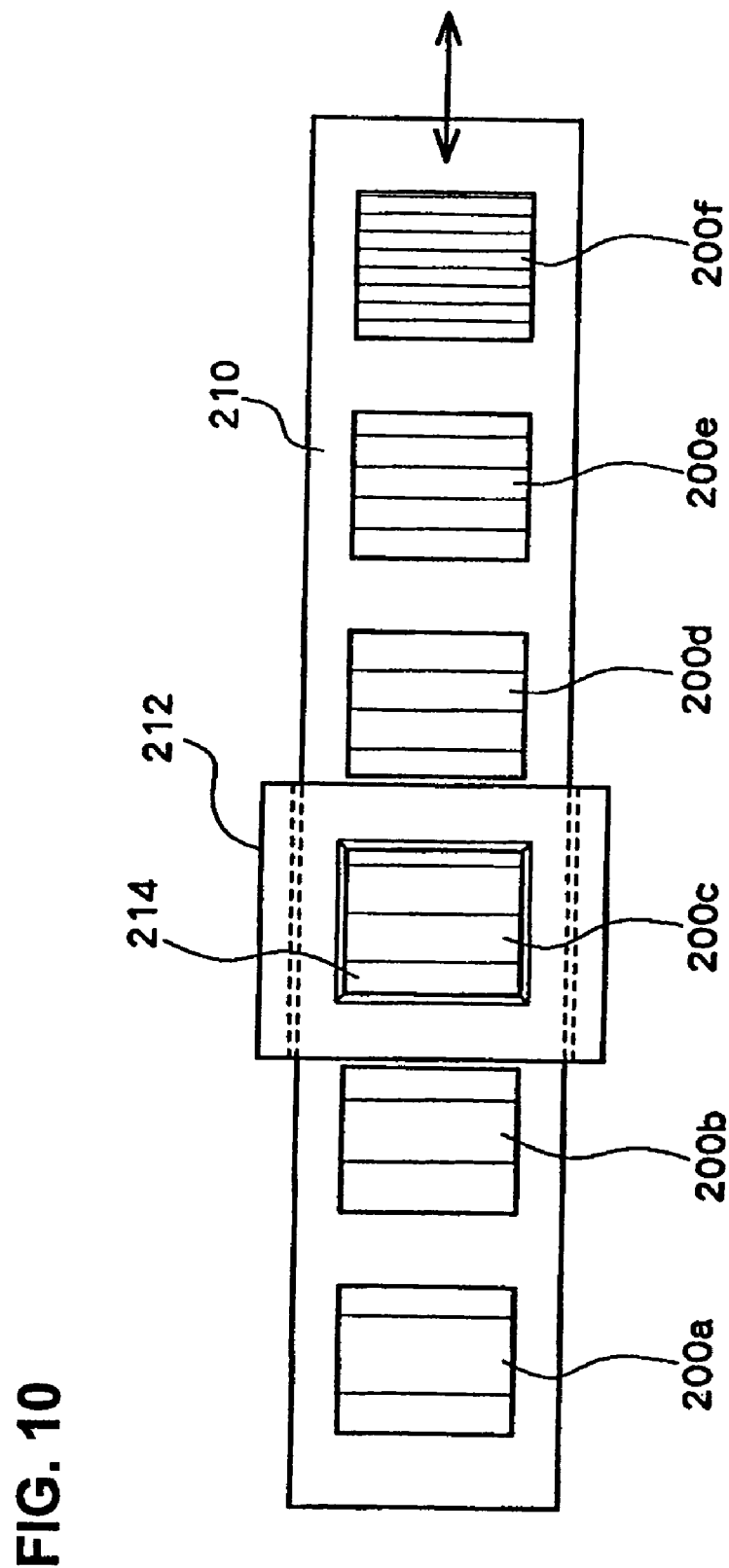
FIG. 10 shows how a plurality of parallel flat plates which cause different amounts of variation in the light path length are disposed in a single row and used in the embodiment of the present invention.

FIG. 10 shows how a plurality of parallel flat plates which cause different amounts of variation in the light path length are disposed in a single row in order to alter the light path length of the light path that passes through the parallel flat plates. The parallel flat plate aligning plate 210 is a part disposed with the parallel flat plates 200a, 200b, 200c, 200d, 200e and 200f, which cause different amounts of variation in the light path length, in a single row on one plate. In order to dispose parallel flat plates that cause the desired amount of variation in the light path length of the parallel flat plate aligning plate 210 in the light path that passes through the parallel flat plates, a passage window 214 that allow the light rays from a single parallel flat plate to pass through, and slide openings on both sides through which the parallel flat plate aligning plate 210 can slide, are formed in the parallel flat plate insertion guide 212. The parallel flat plate aligning plate 210 is inserted from one slide opening toward the other slide opening, and can be set by being caused to slide between these openings so that the desired parallel flat plate part is positioned in the position of the passage window 214.

Figure 11:
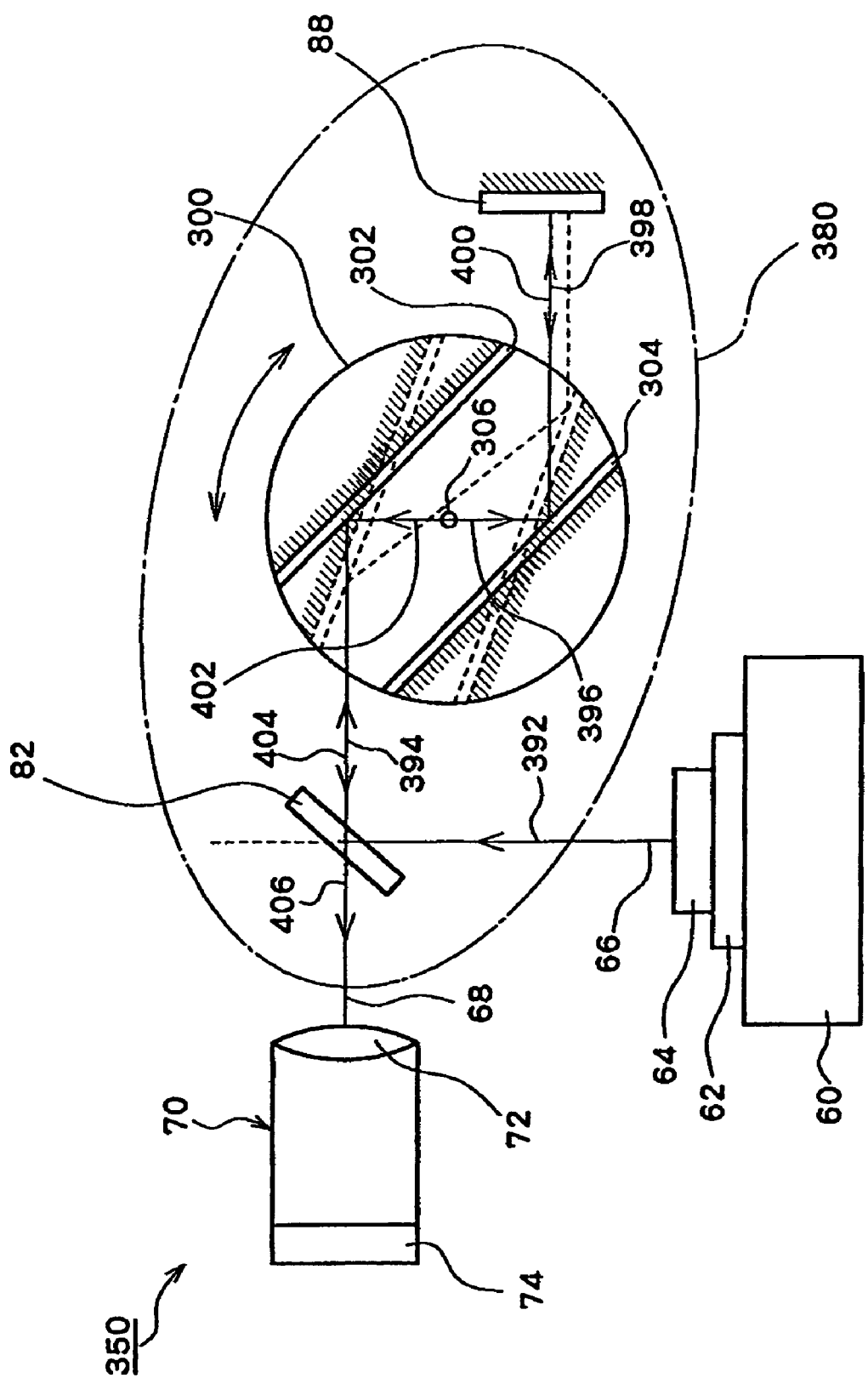
FIG. 11 shows the conditions of a wire bonder using parallel reflective mirror as a new element that alters the light path length of the optical system in another embodiment of the present invention.

FIG. 11 shows a wire bonder 350 that uses a parallel reflective mirror 300 as a new element that alters the light path length of the optical system. Here, elements that are the same as in FIG. 3 are labeled with the same symbols, and a detailed description of such elements is omitted. In FIG. 11, the light rays 66 that leave the stacked element pass through a light path 380 that passes through the parallel reflective mirror that is used to alter the light path length, and these light rays reach the imaging camera 70 as light rays 68. The parallel reflective mirror 300 which is rotatable is disposed in the light path 380 that passes through the parallel reflective mirror.

In FIG. 11, the half-mirror 82 is a semi-transparent mirror which is disposed in the light path at an angle of inclination of 45 degrees with respect to the optical axis of the light rays 66, and which has the function of altering the path of the advance of the light rays 392 from the object by 90 degrees.

The parallel reflective mirror 300 is disposed in the position which receives the light rays 394 whose path of advance has been altered by the half-mirror 82. The parallel reflective mirror 300 is comprised of two reflective surfaces 302 and 304 that are disposed to face each other and parallel to each other at a specified interval in between. The parallel reflective mirror as a whole can be rotated about a rotational axis 306 that is perpendicular to the optical axis. In this construction, the light path length can be varied by rotating the parallel reflective mirror while maintaining a relationship of angle of incidence=angle of emission between the angle of incidence at which the light rays 394 are incident on one reflective surface 302, and the angle of emission of the light rays that are emitted when the light rays 396 reflected by the first reflective surface 302 are further reflected by the other reflective surface 304.

In FIG. 11, an example that shows how the light path length is varied in a case where the parallel reflective mirror as a whole is rotated is indicated by solid and broken lines. As shown therein, when the parallel reflective mirror 300 is rotated about the rotational axis 306, the light path of the light rays reflected by the two reflective surfaces 302 and 304 rotates in the plane perpendicular to the rotational axis 306 while maintaining the relationship of angle of incidence=angle of emission. In other words, the length of the light path of the light rays that pass through the parallel reflective mirror 300 can be varied by such rotation of the parallel reflective mirror 300 about the rotational axis 306. However, as may be understood by comparing the cases of the solid lines and broken lines in FIG. 11, image deviation occurs in the plane perpendicular to the optical axis as a result of the rotation of the parallel reflective mirror 300.

The reflective mirror 88 is an optical element which has the function of receiving the light rays 398 that have passed once through the parallel reflective mirror 300, and performing a mirror reflection operation in the plane perpendicular to the optical axis, so that these light rays are again returned to the parallel reflective mirror 300 as reflected light 400. This mirror has the function of causing the light rays to be incident on the back-side reflective surface 304 of the parallel reflective mirror 300. It would also be possible to use an optical element that reflects the light an odd number of times, such as the optical element combining a pentagonal prism and a triangular prism which reflects the light three times as described in FIG. 5, etc., instead of a reflective mirror.

The reflected light 400 that is returned by the reflective mirror 88 is incident on the other reflective surface 304 of the parallel reflective mirror 300 and is reflected; these reflected light rays 402 are incident on the first reflective surface 302 and are again reflected, so that these light rays advance precisely in the opposite direction along the light path through which the light rays initially passed, and are incident on the half-mirror 82 as light rays 404 that have passed twice through the parallel reflective mirror 300. The half-mirror 82 functions as a transparent optical element with respect to the light rays 404, so that the light rays 404 pass through the half-mirror 82 and are conducted to the imaging camera 70.

Figure 12:
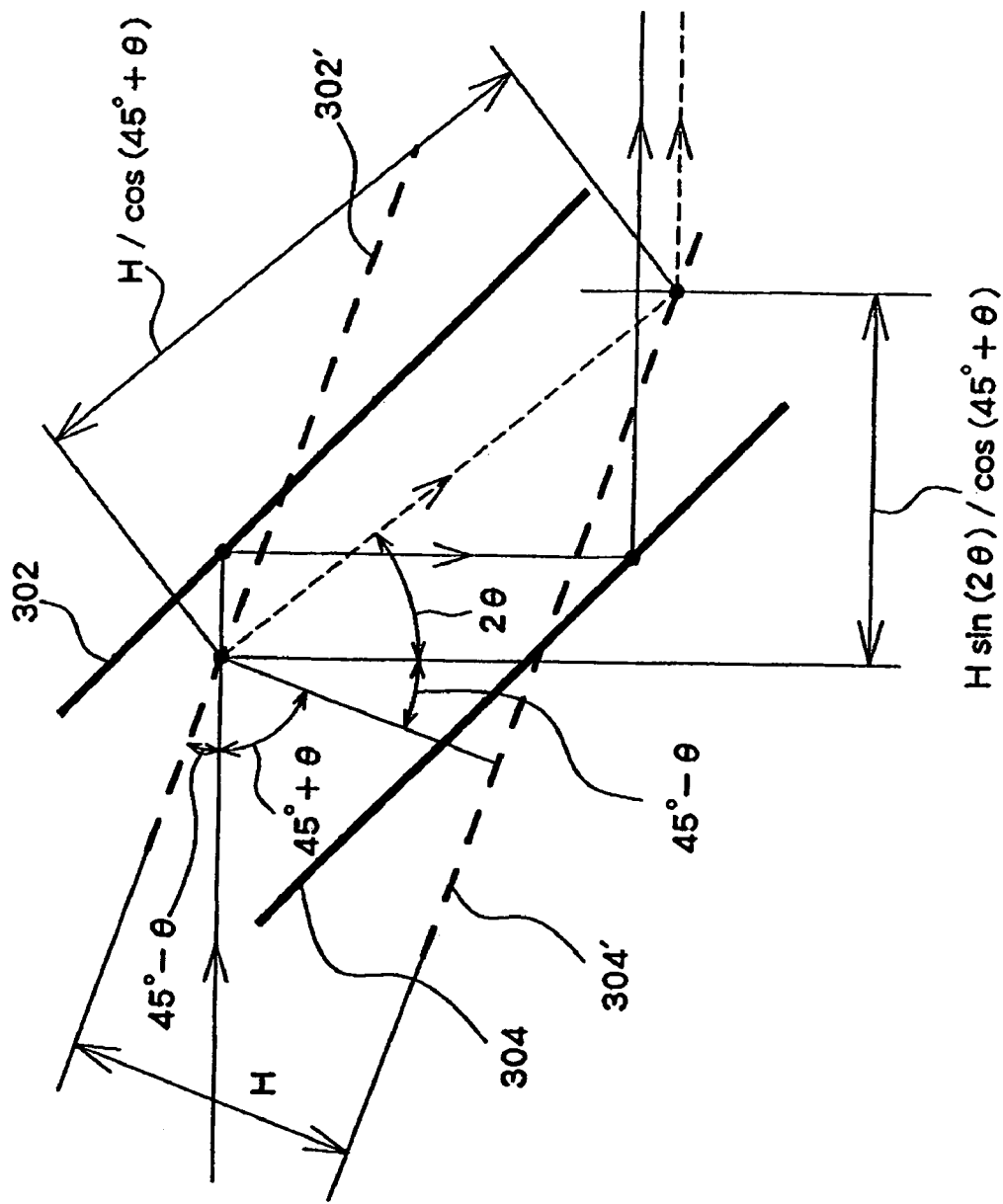
FIG. 12 shows how the amount of variation in the light path length in a case where the parallel reflective mirror is rotated is determined.

FIG. 12 shows how the amount of variation in the length of the light path in a case where the parallel reflective mirror 300 is rotated is determined. Where H is the parallel interval between the two reflective surfaces and θ is the rotational angle of the parallel reflective mirror 300, the amount of variation Δh in the light path length caused by the light passing twice through the parallel reflective mirror 300 at a rotational angle of θ, with reference to the light path length where the angle of incidence (=angle of reflection) is 45 degrees, is given by the following equation:

Numerical Expression 10

$$\Delta h = 2[\{H/\cos(45°+\theta)\} - \{H \sin(2\theta)/\cos(45°+\theta)\} - H/\cos 45°] \quad (10)$$

Since the light rays 66 from the chips 62 and 64 are conducted to the imaging camera 70 as light rays 68 in a state in which the light rays appear to sink by this amount of variation Δh in the light path length, the focal point position of the imaging camera 70 becomes closer by a corresponding amount.

Furthermore, since the light rays 66 from the chips 62 and 64 are subjected to a mirror reflection operation in the plane perpendicular to the optical axis by the reflective mirror 88 after passing one time through the parallel reflective mirror 300, and then pass through the parallel reflective mirror 300 again in the opposite direction along the light path through which the light rays initially passed, the original image can be restored, and the image deviation generated by the rotation of the parallel reflective mirror 300 can be eliminated by mutual cancellation.

Figure 13:
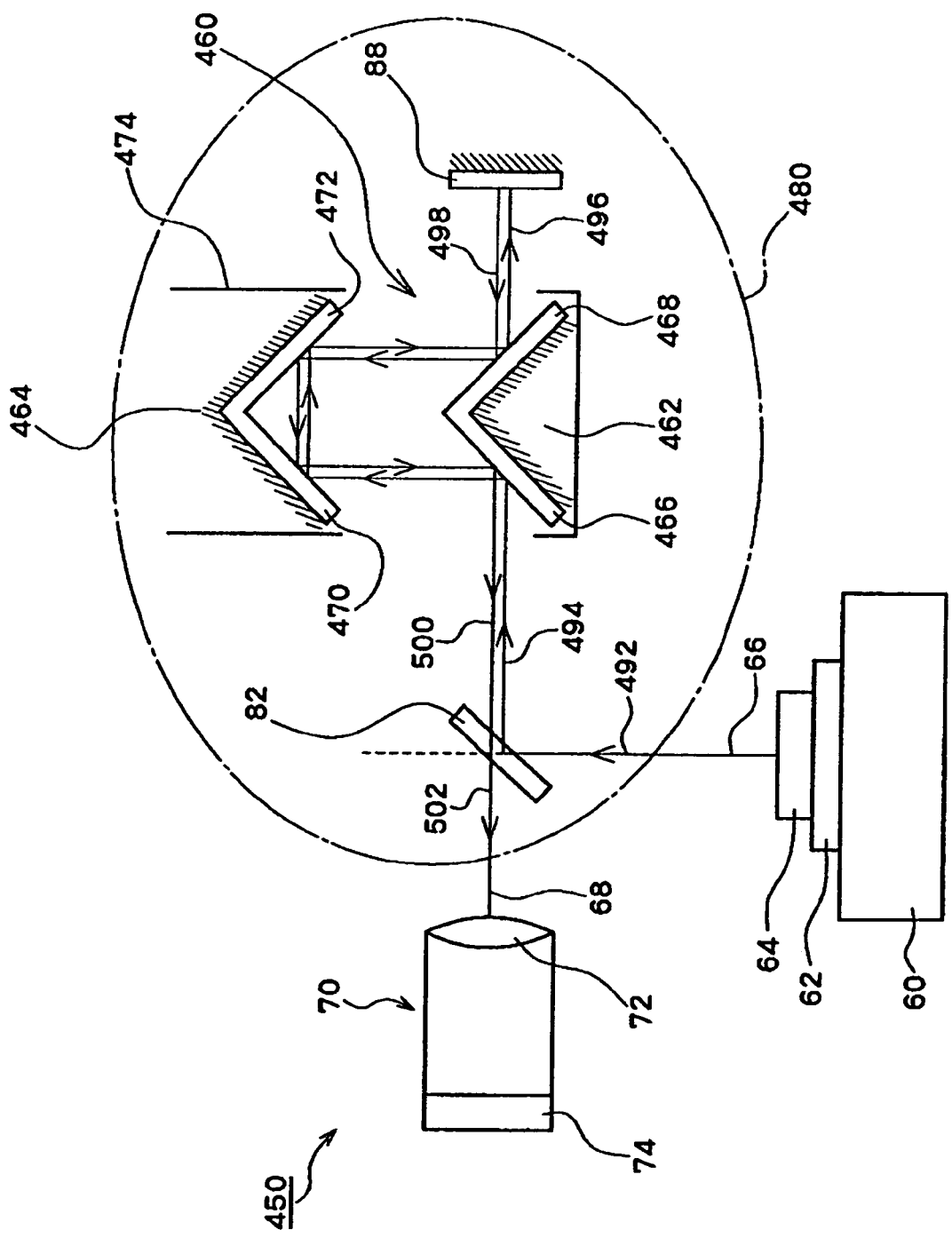
FIG. 13 shows the conditions of a wire bonder using a four-reflection-surface reflective mirror as a new element that alters the light path length of the optical system.
Figure 14A:
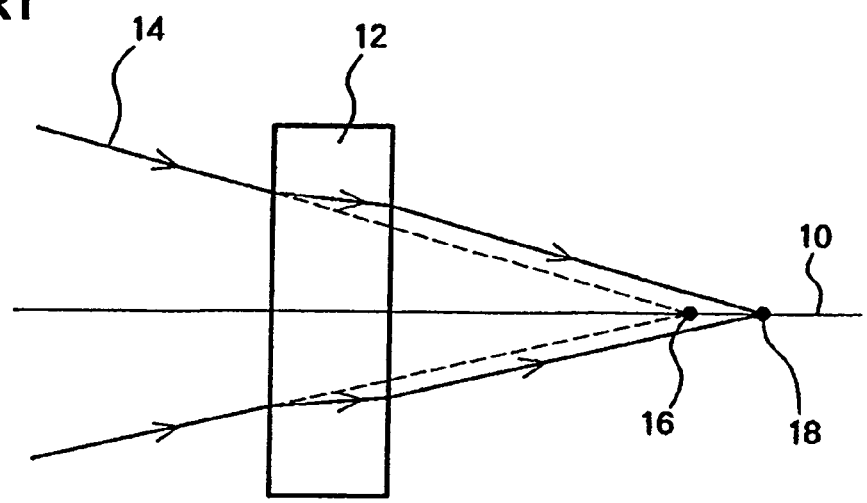
FIG. 14 is a diagram which illustrates the problem points of a conventional technique for varying the light path length using a parallel flat plate.
Figure 14B:
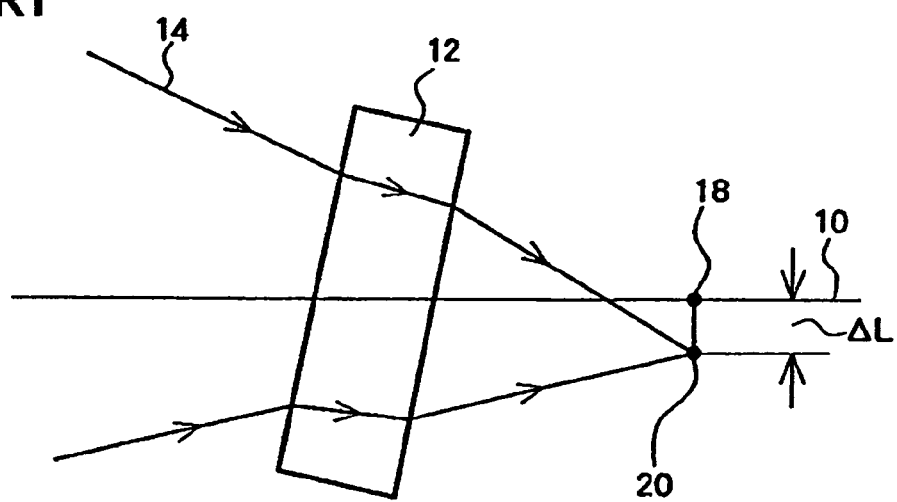

FIG. 13 shows the conditions of a wire bonder 450 that uses a four-reflection-surface reflective mirror 460 as a new element for altering the light path length of the optical system. Elements that are the same as in FIG. 3 or FIG. 11 are labeled with the same symbols, and a detailed description of such elements is omitted. In FIG. 13, the light rays 66 that leave the stacked element pass through a light path 480 which passes through the four-reflection-surface reflective mirror that is used to alter the light path length, and reaches the imaging camera 70 as light rays 68. An insertion guide 474 for the four-reflection-surface reflective mirror which allows the insertion and removal of the four-reflection-surface reflective mirror 460 is disposed in the light path 480 that passes through the four-reflection-surface reflective mirror, and the four-reflection-surface reflective mirror 460 is inserted in this insertion guide 474.

In FIG. 13, the half-mirror 82 is a semi-transparent mirror which is disposed in the light path at an angle of inclination of 45 degrees with respect to the optical axis of the light rays 66, and which has the function of altering the path of the advance of the light rays 492 from the object by 90 degrees.

The four-reflection-surface reflective mirror 460 is a reflective mirror with four reflective surfaces which is disposed in a position that receives the light rays 494 whose path of advance has been altered by the half-mirror 82, and in which the four reflective surfaces are disposed parallel to each other and facing each other at a specified interval. In concrete terms, this mirror comprises a right-angled outside reflective mirror 462 and a right-angled inside reflective mirror 464; the right-angled outside reflective mirror 462 is disposed so that the first reflective surface 466 and second reflective surface 468 have an angle of 270 degrees, and the right-angled inside reflective mirror 464 is disposed so that the third reflective surface 470 and fourth reflective surface 472 have an angle of 90 degrees. Furthermore, the first reflective surface 466 and third reflective surface 470 are caused to face each other, the second reflective surface 468 and fourth reflective surface 472 are caused to face each other, and the respective facing reflective surfaces are disposed parallel to each other at a specified interval. Moreover, the four-reflection-surface reflective mirror 460 as a whole is disposed so that the angle of incidence at which the light rays 494 are incident on the first reflective surface 466 is 45 degrees.

In this construction, the light rays 494 that are incident on the first reflective surface 466 of the four-reflection-surface reflective mirror 460 are repeatedly reflected in order by the third reflective surface 470, fourth reflective surface 472 and second reflective surface 468 in the relationship of angle of incidence=angle of reflection=45 degrees, and leave the second reflective surface 468 as light rays 496. Here, the length of the light path of the light rays that pass through the four-reflection-surface reflective mirror 460 is correspondingly extended compared to a case in which the four-reflection-surface reflective mirror 460 is not inserted in the light path.

In other words, the length of the light path of the optical system can be altered by inserting the four-reflection-surface reflective mirror 460 into the light path or removing this mirror 460 from the light path. In this case, if the four-reflection-surface reflective mirror 460 as a whole is disposed at an inclination with respect to the optical axis, an image deviation in the plane perpendicular to the optical axis is generated in the light rays 496 from the reflective surface 468.

The reflective mirror 88 is an optical element which has the function of receiving the light rays 496 that have passed once through the four-reflection-surface reflective mirror 460, and performing a mirror reflection operation in the plane perpendicular to the optical axis, so that these light rays are again returned to the four-reflection-surface reflective mirror 460 as reflected light 498. This mirror has the function of causing the reflected light 498 to be incident on the second reflective surface 468 at an angle of incidence of 45 degrees from the back side of the four-reflection-surface reflective mirror 460. It would also be possible to use an optical element that reflects the light an odd number of times, such as the optical element combining a pentagonal prism and a triangular prism which reflects the light three times as described in FIG. 5, etc., instead of a reflective mirror.

The reflected light 498 that is returned by the reflective mirror 88 passes through the second reflective surface 468, fourth reflective surface 472, third reflective surface 470 and first reflective surface 466 of the four-reflection-surface reflective mirror 460, thus taking a light path that is an opposite light path from the one followed by the light rays that initially passed through. This light is then incident on the half-mirror 82 as light rays 500 that have passed twice through the four-reflection-surface reflective mirror 460 from the first reflective surface 466. The half-mirror 82 functions as a transparent optical element with respect to the light rays 500, so that the light rays 500 pass through the half-mirror 82 and are conducted to the imaging camera 70.

If the light path length between the first reflective surface 466 and third reflective surface 470 is designated as $t_1$, then, since the light path length between the fourth reflective surface 472 and second reflective surface 468 is also $t_1$, the amount of variation $\Delta t$ in the light path length caused by the passing of the light rays twice through the four-reflection-surface reflective mirror 460 is given by the following equation:

Numerical Expression 11

$$\Delta t = 4 t_1 \quad (11)$$

Since the light rays 66 from the chips 62 and 64 are conducted to the imaging camera 70 as light rays 68 in a state in which the light rays appear to sink by an amount corresponding to this amount of variation $\Delta t$ in the light path length, the focal point position of the imaging camera 70 becomes closer by a corresponding amount.

Furthermore, the light rays 66 from the chips 62 and 64 are subjected to a mirror reflection operation in the plane perpendicular to the optical axis by the reflective mirror 88, and thus again pass through the four-reflection-surface reflective mirror 460 after passing once through the four-reflection-surface reflective mirror 460; accordingly, even in a case where the four-reflection-surface reflective mirror 460 is for some reason not disposed perpendicular to the optical axis, the image deviation that is generated by passage through the four-reflection-surface reflective mirror 460 can be eliminated by mutual cancellation as explained in the first method described in the principle of the present invention.

The bonding apparatus of the present invention makes it possible to prevent image deviation that is generated when the focal point position of the optical imaging instrument is varied.

The invention claimed is:

1. A bonding apparatus which performs bonding with a focal point position varied for an object of bonding that has a plurality of different heights, said bonding being performed using an optical measuring instrument that includes:
   an image focusing lens,
   a two-dimensional image sensor that detects an image of each object of bonding created by said image focusing lens, and
   a light path that passes through a parallel flat plate, said light path being disposed at an intermediate point in a light path that extends from said object of bonding toward said two-dimensional image sensor;
   wherein said bonding apparatus is characterized in that
   said light path that passes through a parallel flat plate is a light path which:
      receives light rays from said object of bonding,
      conducts light rays from said object of bonding to said two-dimensional image sensor after causing said light rays from said object of bonding to pass twice through a parallel flat plate that has a refractive index and thickness that corresponds to a height of said object of bonding, and
      varies a focal point position of an optical system while eliminating by mutual cancellation an image deviation generated by a passage of said light rays through said parallel flat plate.

2. The bonding apparatus according to claim 1 characterized in that,
   a mirror-reflection-operation optical element, which performs a mirror reflection operation, in a plane perpendicular to an optical axis, on light rays that are incident from one surface of said parallel flat plate and pass through said parallel flat plate, thus causing said light rays to be incident on another surface of said parallel flat plate, is provided in said light path that passes through said parallel flat plate,
   so that light rays, which are incident from said other surface of said parallel flat plate and again passes through said parallel flat plate, are conducted to said two-dimensional image sensor.

3. The bonding apparatus according to claim 1, characterized in that a rotational-operation optical element which makes a 180-degree rotational operation about an optical axis on light rays that are incident from one surface of said parallel flat plate and pass through said parallel flat plate, thus causing said light rays to be incident again on said first surface of the parallel flat plate, is provided in said light path that passes through said parallel flat plate, so that
   light rays, which again pass through said parallel flat plate, are conducted to said two-dimensional image sensor.

4. The bonding apparatus according to claim 1, characterized in that said light path that passes through said parallel flat plate is provided at an intermediate point on a light path that extends from said object of bonding toward said image focusing lens, in a case where an optical system of said optical measuring instrument is an object-side telecentric optical system.

5. The bonding apparatus according to claim 1, characterized in that said apparatus includes:
   a parallel flat plate set in which a plurality of parallel flat plates in which an amount of light path length variation is respectively different are provided as a single set, and
   a parallel flat plate selection and disposition means which selects at least one parallel flat plate from said parallel flat plate set and disposes selected flat plate in said light path that passes through parallel flat plates.

6. The bonding apparatus according to claim 5, characterized in that ratio of said amount of light path length variation between the respective parallel flat plates in said parallel flat plate set is set to be 2.

7. A bonding apparatus which performs bonding with a focal point position varied for an object of bonding that has a plurality of different heights, said bonding being performed using an optical measuring instrument that includes:
   an image focusing lens,
   a two-dimensional image sensor that detects an image of each object of bonding created by said image focusing lens, and
   a light path that passes through a light path length varying element, said light path being disposed at an intermediate point in a light path that extends from said object of bonding toward said two-dimensional image sensor;
   wherein said bonding apparatus is characterized in that:
   said light path that passes through a light path length varying element includes a parallel reflective mirror as a light path length varying element, said parallel reflective mirror being comprised of two reflective surfaces facing each other and disposed parallel to each other at a specified interval and varying a light path length of light rays that pass through said parallel reflective mirror when said parallel reflective mirror is rotated as a whole about a rotational axis that is perpendicular to an optical axis; and
   said light path that passes through a light path length varying element is a light path which:
      receives light rays from the object of bonding,
      conducts the light rays from the object of bonding to said two-dimensional image sensor after causing said light rays from the object of bonding to pass twice through said parallel reflective mirror that varies the light path length according to a height of the object of bonding, and
varies a focal point position of an optical system while eliminating, by mutual cancellation, an image deviation generated by a passing of said light rays through said parallel reflective mirror.

8. A bonding apparatus which performs bonding with a focal point position varied for an object of bonding that has a plurality of different heights, said bonding being performed using an optical measuring instrument that includes:
an image focusing lens,
a two-dimensional image sensor that detects an image of each object of bonding created by said image focusing lens, and
a light path that that passes through a light path length varying element, said light path being disposed at an intermediate point in a light path that extends from said object of bonding toward said two-dimensional image sensor;
wherein said bonding apparatus is characterized in that:
said light path that passes through a light path length varying element includes a four-reflection-surface reflective mirror as a light path length varying element, said four-reflection-surface reflective mirror being comprised of four reflective surfaces facing each other and disposed parallel to each other at a specified interval and varying a light path length that corresponds to a light path length inside said four-reflection-surface reflective mirror, relative to a case in which said four-reflection-surface reflective mirror is not inserted, when said four-reflection-surface reflective mirror is inserted as a whole in a light path; and
said light path that passes through a light path length varying element is a light path which:
receives light rays from the object of bonding,
conducts the light rays from the object of bonding to said two-dimensional image sensor after causing said light rays from the object of bonding to pass twice through said four-reflection-surface reflective mirror that has a light path length corresponding to a height of the object of bonding, and
varies a focal point position of an optical system while eliminating, by mutual cancellation, an image deviation generated by a passing of said light rays through said four-reflection-surface reflective mirror.

9. The bonding apparatus according to claim 7 or 8, characterized in that:
a mirror-reflection-operation optical element, which performs a mirror reflection operation in a plane perpendicular to optical axis on said light rays that are incident from one side of said light path length varying element and pass through said light path length varying element, thus causing said light rays to be incident on another side of said light path length varying element, is disposed in said light path that passes through a light path length varying element;
so that said light rays, which are incident from said another side of said light path length varying element and again pass through said light path length varying element, are conducted to said two-dimensional image sensor.

10. The bonding apparatus according to claim 7 or 8, characterized in that:
a rotational-operation optical element, which makes a 180-degree rotational operation about optical axis on said light rays that are incident from one side of said light path length varying element and pass through said light path length varying element, thus causing said light rays to be incident again on said one side of said light path length varying element, is disposed in the light path that passes through a light path length varying element;
so that said light rays that again pass through said light path length varying element are conducted to said two-dimensional image sensor.

11. The bonding apparatus according to claim 7 or 8, characterized in that in a case where an optical system of said optical measuring instrument is an object-side telecentric optical system, said light path that passes through a light path length varying element is provided at an intermediate point on a light path that extends from said object of bonding toward said image focusing lens.

12. The bonding apparatus according to claim 8, characterized in that said four-reflection-surface reflective mirror is comprised of:
a right-angled outside reflective mirror in which a first reflective surface and a second reflective surface are disposed at an angle of 270 degrees, and
a right-angled inside reflective mirror in which a third reflective surface and a fourth reflective surface are disposed at an angle of 90 degrees; and
said first reflective surface and third reflective surface are provided to face each other, said second reflective surface and fourth reflective surface are provided to face each other, and said reflective surfaces facing each other are parallel to each other at a specified interval.

13. The bonding apparatus according to claim 2 or 9, characterized in that said mirror-reflection-operation optical element is a reflective mirror.

14. The bonding apparatus according to claim 2 or 9, characterized in that said mirror-reflection-operation optical element is an optical element that is a combination of a pentagonal prism and a triangular prism.

15. The bonding apparatus claim 3 or 10, characterized in that said rotational-operation optical element is comprised of a first prism that reflects incident light rays twice and a second prism that twice reflects light rays from said first prism.

16. A bonding external appearance inspection apparatus which performs a bonding external appearance inspection with a focal point position varied for an object of bonding that has a plurality of different heights, said inspection being performed using an optical measuring instrument that includes:
an image focusing lens,
a two-dimensional image sensor that detects an image of each object of bonding created by said image focusing lens, and
a light path that passes through a parallel flat plate, said light path being disposed at an intermediate point in a light path that extends from said object of bonding toward said two-dimensional image sensor;
wherein said bonding external appearance inspection apparatus is characterized in that
said light path that passes through a parallel flat plate is a light path which:
receives light rays from the object of bonding,
conducts said light rays from the object of bonding to said two-dimensional image sensor after causing said light rays from the object of bonding to pass twice through a parallel flat plate that has a refractive index and thickness that corresponds to a height of the object of bonding, and varies a focal point position of an optical system while eliminating an image deviation generated by the passing of said light rays through a parallel flat plate.

17. A bonding external appearance inspection apparatus which performs a bonding external appearance inspection with a focal point position varied for an object of bonding that has a plurality of different heights, said inspection being performed using an optical measuring instrument that includes:

an image focusing lens, a two-dimensional image sensor that detects an image of each object of bonding created by said image focusing lens, and a light path that that passes through a light path length varying element, said light path being disposed at an intermediate point in a light path that extends from said object of bonding toward said two-dimensional image sensor;

wherein said bonding external appearance inspection apparatus is characterized in that:

said light path that passes through a light path length varying element includes a parallel reflective mirror as a light path length varying element, said parallel reflective mirror being comprised of two reflective surfaces facing each other and disposed parallel to each other at a specified interval and varying a light path length of light rays that pass through said parallel reflective mirror when said parallel reflective mirror is rotated as a whole about a rotational axis that is perpendicular to an optical axis; and said light path that passes through a light path length varying element is a light path which:

receives light rays from the object of bonding, conducts the light rays from the object of bonding to said two-dimensional image sensor after causing said light rays from the object of bonding to pass twice through said parallel reflective mirror that varies the light path length according to a height of the object of bonding, and varies a focal point position of an optical system while eliminating, by mutual cancellation, an image deviation generated by a passing of said light rays through said parallel reflective mirror.

18. A bonding external appearance inspection apparatus which performs a bonding external appearance inspection with a focal point position varied for an object of bonding that has a plurality of different heights, said inspection being performed using an optical measuring instrument that includes:

an image focusing lens, a two-dimensional image sensor that detects an image of each object of bonding created by said image focusing lens, and a light path that that passes through a light path length varying element, said light path being disposed at an intermediate point in a light path that extends from said object of bonding toward said two-dimensional image sensor;

wherein said bonding external appearance inspection apparatus is characterized in that:

said light path that passes through a light path length varying element includes a four-reflection-surface reflective mirror as a light path length varying element, said four-reflection-surface reflective mirror being comprised of four reflective surfaces facing each other and disposed parallel to each other at a specified interval and varying a light path length that corresponds to a light path length inside said four-reflection-surface reflective mirror, relative to a case in which said four-reflection-surface reflective mirror is not inserted, when said four-reflection-surface reflective mirror is inserted as a whole in a light path; and said light path that passes through a light path length varying element is a light path which:

receives light rays from the object of bonding, conducts the light rays from the object of bonding to said two-dimensional image sensor after causing said light rays from the object of bonding to pass twice through said four-reflection-surface reflective mirror that has a light path length corresponding to a height of the object of bonding, and varies a focal point position of an optical system while eliminating, by mutual cancellation, an image deviation generated by a passing of said light rays through said four-reflection-surface reflective mirror.

* * * * *